United States Patent
Nakanishi et al.

(10) Patent No.: US 9,939,696 B2
(45) Date of Patent: Apr. 10, 2018

(54) ACTIVE MATRIX SUBSTRATE AND DISPLAY DEVICE INCLUDING ACTIVE MATRIX SUBSTRATE

(71) Applicant: Sharp Kabushiki Kaisha, Sakai, Osaka (JP)

(72) Inventors: Youhei Nakanishi, Sakai (JP); Takayuki Nishiyama, Sakai (JP); Kohhei Tanaka, Sakai (JP); Takeshi Noma, Sakai (JP); Ryo Yonebayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/305,394

(22) PCT Filed: Apr. 28, 2015

(86) PCT No.: PCT/JP2015/062770
§ 371 (c)(1),
(2) Date: Oct. 20, 2016

(87) PCT Pub. No.: WO2015/166937
PCT Pub. Date: Nov. 5, 2015

(65) Prior Publication Data
US 2017/0038650 A1 Feb. 9, 2017

(30) Foreign Application Priority Data
Apr. 30, 2014 (JP) .................. 2014-094073

(51) Int. Cl.
*G09G 3/36* (2006.01)
*G02F 1/1362* (2006.01)
(Continued)

(52) U.S. Cl.
CPC ...... *G02F 1/136204* (2013.01); *G02F 1/1343* (2013.01); *G02F 1/1368* (2013.01);
(Continued)

(58) Field of Classification Search
CPC ............ G02F 1/136204; G02F 1/1368; G09G 3/3688; G09G 2310/08; G09G 2300/08;
(Continued)

(56) References Cited

U.S. PATENT DOCUMENTS 5,652,632 A 7/1997 Shimizu
5,909,035 A 6/1999 Kim
(Continued)

FOREIGN PATENT DOCUMENTS

CN 102150191 A 8/2011
JP 61-079259 A 4/1986
(Continued)

*Primary Examiner* — Jennifer Nguyen
(74) *Attorney, Agent, or Firm* — Keating & Bennett, LLP

(57) ABSTRACT

Provided is an active matrix substrate that can protected from static electricity, with the frame region being narrowed. An active matrix substrate (20a) includes a plurality of first lines (GL), a plurality of second lines (SL), and a protection part (50). The first lines are formed in a display region (30). The second lines are formed in the display region, and intersect with the first lines. The protection part protects the active matrix substrate from static electricity. The protection part includes a plurality of first protection circuits (50A), and a conductive unit (50B). The first protection circuits are connected to each of the first lines in the display region. The conductive unit is connected to each of the first protection circuits in the display region. Each of the first protection circuits, according to a potential of the first line to which the first protection circuit is connected, allows the first line and the conductive unit to be conductive with each other.

10 Claims, 31 Drawing Sheets

(51) Int. Cl.
*G02F 1/1343* (2006.01)
*G02F 1/1368* (2006.01)
*G09F 9/30* (2006.01)
*H01L 21/822* (2006.01)
*H01L 27/04* (2006.01)
*H01L 29/786* (2006.01)
*H01L 27/02* (2006.01)
*H01L 27/12* (2006.01)

(52) U.S. Cl.
CPC ............ *G09F 9/30* (2013.01); *G09G 3/3648* (2013.01); *G09G 3/3688* (2013.01); *H01L 21/822* (2013.01); *H01L 27/0255* (2013.01); *H01L 27/0266* (2013.01); *H01L 27/04* (2013.01); *H01L 27/1244* (2013.01); *H01L 29/786* (2013.01); *G09G 2300/0413* (2013.01); *G09G 2300/0426* (2013.01); *G09G 2300/08* (2013.01); *G09G 2310/08* (2013.01); *G09G 2330/04* (2013.01); *G09G 2330/08* (2013.01)

(58) Field of Classification Search
CPC ............ H01L 27/1244; H01L 27/0255; H01L 27/0266
USPC ............ 345/87, 89, 204, 212, 690; 349/40
See application file for complete search history.

(56) References Cited

U.S. PATENT DOCUMENTS

| | | | |
|---|---|---|---|
| 6,839,097 B2* | 1/2005 | Park | G02F 1/13452 349/40 |
| 6,914,643 B1 | 7/2005 | Nagase et al. | |
| 7,375,724 B2* | 5/2008 | Jiang | G02F 1/136204 345/204 |
| 2003/0020845 A1* | 1/2003 | Lee | G02F 1/136204 349/40 |
| 2004/0027502 A1 | 2/2004 | Tanaka et al. | |
| 2008/0079859 A1* | 4/2008 | Ota | G02F 1/136204 349/40 |
| 2010/0065840 A1 | 3/2010 | Yamazaki et al. | |
| 2011/0187950 A1 | 8/2011 | Matsushima et al. | |
| 2014/0071109 A1* | 3/2014 | Tseng | G09G 3/3648 345/211 |
| 2015/0028338 A1* | 1/2015 | Iwata | H01L 27/14632 257/59 |
| 2015/0255449 A1* | 9/2015 | Kim | G02F 1/136204 349/40 |
| 2016/0210923 A1* | 7/2016 | Yoshida | G09G 3/3677 |

FOREIGN PATENT DOCUMENTS

| | | |
|---|---|---|
| JP | 63-010558 A | 1/1988 |
| JP | 08-101397 A | 4/1996 |
| JP | 10-303431 A | 11/1998 |
| JP | 2005-275004 A | 10/2005 |
| JP | 2009-187029 A | 8/2009 |
| JP | 2011-158690 A | 8/2011 |

* cited by examiner

ACTIVE MATRIX SUBSTRATE AND DISPLAY DEVICE INCLUDING ACTIVE MATRIX SUBSTRATE

TECHNICAL FIELD

The present invention relates to an active matrix substrate and a display device including the active matrix substrate, and more specifically relates to a configuration for protecting an active matrix substrate from static electricity.

BACKGROUND ART

Display devices have been proposed in which circuit elements provided in a display region are protected from static electricity. Such a display device is disclosed in, for example, JP-A-63(1988)-10558.

In the above-mentioned disclosure, a plurality of areas each of which is enclosed by scanning lines and signal lines are formed. These areas are arranged in matrix. In each area, a display element and an active element are arranged. With this configuration, a pixel is formed. Between the scanning line and the ground line, and between the signal line and the ground line, switching elements are arranged. With the switching elements, the active element is protected from static electricity.

SUMMARY OF THE INVENTION

In the above-mentioned disclosure, the switching elements are arranged outside the display region. This makes it difficult to decrease the width of the frame region arranged around the display region.

It is an object of the present invention to provide an active matrix substrate that can be protected from static electricity, with a frame region thereof being narrowed, and to provide a display device including the active matrix substrate.

An active matrix substrate according to an embodiment of the present invention includes a plurality of first lines, a plurality of second lines, and a protection part. The first lines are formed in a display region. The second lines are formed in the display region, and intersect with the first lines. The protection part protects the active matrix substrate from static electricity. The protection part includes a plurality of first protection circuits, and a conductive unit. The first protection circuits are connected to each of the first lines in the display region. The conductive unit is connected to each of the first protection circuits in the display region. Each of the first protection circuits, according to a potential of the first line to which the first protection circuit is connected, allows the first line and the conductive unit to be conductive with each other.

A display device according to an embodiment of the present invention includes the above-described active matrix substrate.

The active matrix substrate and the display device according to an embodiment of the present invention are configured so that the active matrix substrate can be protected from static electricity, and at the same time, the frame region can be narrowed.

MODE FOR CARRYING OUT THE INVENTION

Figure 1:
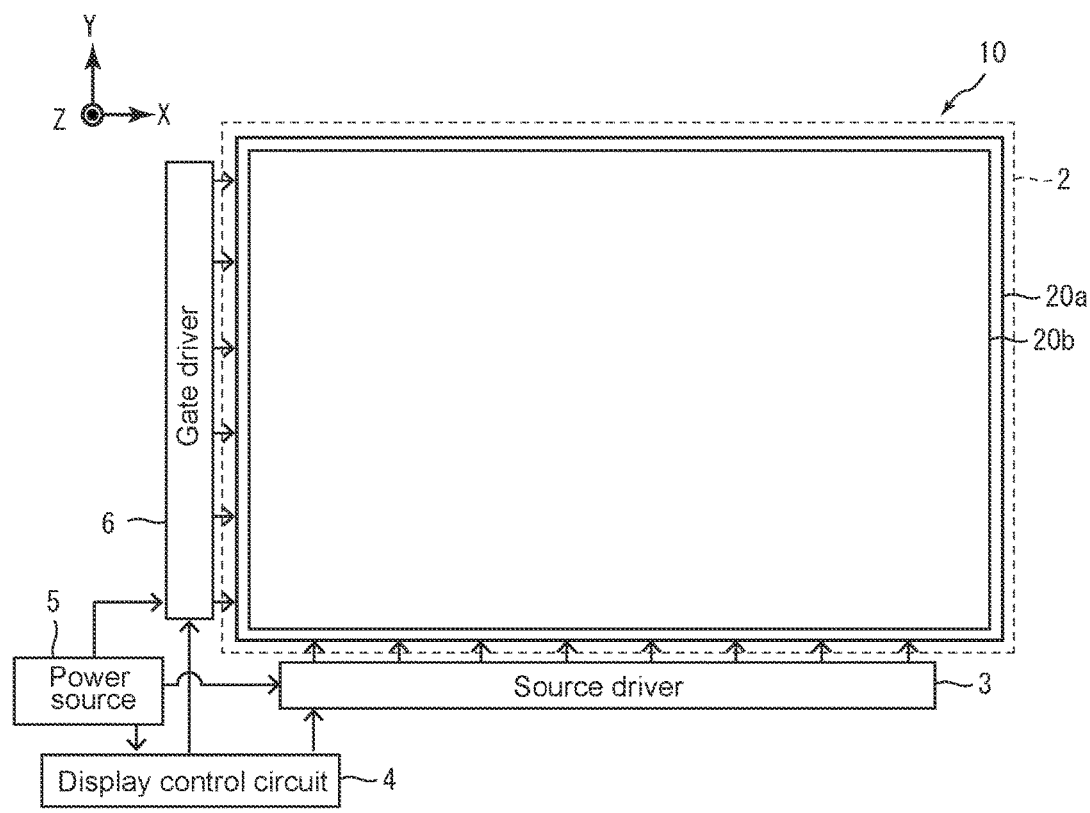
FIG. 1 is a schematic diagram illustrating a schematic configuration of a liquid crystal display device according to Embodiment 1.

An active matrix substrate according to an embodiment of the present invention includes a plurality of first lines, a plurality of second lines, and a protection part. The first lines are formed in a display region. The second lines are formed in the display region, and intersect with the first lines. The protection part protects the active matrix substrate from static electricity. The protection part includes a plurality of first protection circuits and a conductive unit. The first protection circuits are connected to each of the first lines in the display region. The conductive unit is connected to each of the first protection circuits in the display region. Each of the first protection circuits, according to a potential of the first line to which the first protection circuit is connected, allows the first line and the conductive unit to be conductive with each other.

In the above-described active matrix substrate, the first protection circuit, for example, is capable of suppressing discharge caused by static electricity at points of intersection between the first lines and the second lines, or discharge caused by static electricity at circuit elements connected to the first lines or the second lines. Particularly, when an active matrix substrate or a display device that includes an active matrix substrate is manufactured, the above-described discharge can be suppressed. Consequently, the active matrix substrate can be protected from static electricity.

Here, in the active matrix substrate, a plurality of first protection circuits are arranged in a display region. Therefore, as compared with a case where a plurality of first protection circuits are arranged outside a display region, the width of a frame region formed around the display region can be decreased.

In the active matrix substrate according to an embodiment of the present invention, the conductive unit includes a first line part, a second protection circuit, and a second line part. The first line part is connected to the first protection circuit in the display region. The second protection circuit is connected to the first line part. The second line part is connected to the second protection circuit.

In this case, when an increase (or a decrease) of the potential of the first line is caused by static electricity, the potential of the first line can be decreased (or increased) by the first protection circuit and the second protection circuit. Therefore, as compared with a case where the decrease (or increase) of the potential of the first line is achieved by the first protection circuit alone, the decrease (or increase) of the potential of the first line can be achieved more easily.

In the above-described active matrix substrate, at least a part of the first line part may be formed in the display region.

In the active matrix substrate according to an embodiment of the present invention, the conductive unit includes a first line part, a second protection circuit, and a second line part. The first line part is connected to the first protection circuit in the display region. The second protection circuit is connected to the first line part. The second line part is connected to the second protection circuit. The protection part further includes a plurality of second protection circuits. The second protection circuits are connected to each of the second lines, and are connected to the second line part.

In this case, the potentials of the first lines and the potentials of the second lines can be made the same. This makes it easier to protect the active matrix substrate.

In the above-described active matrix substrate, at least a part of the first line part may be formed in the display region.

In the active matrix substrate according to an embodiment of the present invention, the conductive unit includes a first line part, a second protection circuit, and a second line part. The first line part is connected to the first protection circuit in the display region. The second protection circuit is connected to the first line part. The second line part is connected to the second protection circuit. The protection part further includes a plurality of third protection circuits. The third protection circuits are connected to each of the first lines in the display region, and are different from the first protection circuits. The conductive unit further includes a third line part, and a fourth protection circuit. The third line part is connected to each of the third protection circuits in the display region. The fourth protection circuit is connected to the third line part, and is connected to the second line part.

In this case, in a case where, for example, damage of the first protection circuit caused by static electricity or the like makes it impossible to protect the active matrix substrate with the first protection circuit, the active matrix substrate can be protected by the third protection circuit.

In the above-described active matrix substrate, at least a part of the first line part and the third line part may be formed in the display region.

In the active matrix substrate according to an embodiment of the present invention, the first lines include a plurality of gate lines. The active matrix substrate further includes a driving unit. The driving unit is connected to the gate lines to control potentials of the gate lines. The driving unit includes a plurality of gate drivers. The gate drivers are arranged in the display region, and at least one of the gate drivers is connected to each of the gate lines.

In this case, the gate drivers are arranged in the display region. Therefore, as compared with a case where the gate drivers are arranged outside the display region, the width of the frame region can be decreased.

In the active matrix substrate according to an embodiment of the present invention, the conductive unit includes a first line part, a second protection circuit, and a second line part. The first line part is connected to the first protection circuit in the display region. The second protection circuit is connected to the first line part. The second line part is connected to the second protection circuit. The first lines include a plurality of gate lines. The active matrix substrate further includes a driving unit. The driving unit is connected to the gate lines to control potentials of the gate lines. The driving unit includes a plurality of gate drivers. The gate drivers are arranged in the display region, and at least one of the gate drives is connected to each of the gate lines. The first lines further include a plurality of internal lines. At least one of the internal lines is provided in each of the gate drivers. The first protection circuits are connected to each of the gate lines. The protection part further includes a plurality of fourth protection circuits. The fourth protection circuits are different from the first protection circuits. The fourth protection circuits are connected to each of the internal lines in the display region, and are connected to the first line part.

In this case, discharge caused by static electricity in circuit elements composing the gate drivers can be suppressed. Further, as the gate drivers are arranged in the display region, the width of the frame region can be decreased, as compared with a case where the gate drivers are arranged outside the display region.

In the active matrix substrate according to an embodiment of the present invention, the first protection circuit may include a first diode and a second diode. Here, the second diode is arranged in parallel to the first diode, and is connected in an orientation opposite to that for the first diode.

In the active matrix substrate according to an embodiment of the present invention, the first protection circuit may include a first thin film transistor, and a second thin film transistor. Here, the second thin film transistor is provided in parallel to the first thin film transistor. In this case, either one of the source and the drain of the first thin film transistor is connected to the gate of the first thin film transistor, so that the first diode is formed. Either one of the source and the drain of the second thin film transistor is connected to the gate of the second thin film transistor, so that the second diode is formed.

In this case, by using the semiconductor process, the first diode and the second diode can be formed.

The active matrix substrate according to an embodiment of the present invention further includes a plurality of pixel electrodes arranged in the display region. Each of the pixel electrodes includes a portion that that does not contribute to display. The conductive unit includes a first line part, a second protection circuit, and a second line part. The first line part is connected to the first protection circuit in the display region. The second protection circuit is connected to the first line part. The second line part is connected to the second protection circuit. The first line part includes a portion that overlaps the portion that does not contribute to display.

In this case, a part of the conductive unit overlaps a portion of the pixel electrode that does not contribute to display. This makes it possible to suppress the reduction of the light transmittance of the pixel.

The active matrix substrate according to an embodiment of the present invention further includes a plurality of pixel electrodes arranged in the display region. Each of the pixel electrodes includes a plurality of electrode portions. The electrode portions extend in a first direction, and are arrayed in a second direction that intersects with the first direction. An edge in the second direction of each of the electrode portions extends in a direction that intersects with the first direction. The conductive unit includes a first line part, a second protection circuit, and a second line part. The first line part is connected to the first protection circuit in the display region. The second protection circuit is connected to the first line part. The second line part is connected to the second protection circuit. The first line part extends in the first direction, and overlaps any one of the electrode portions. An edge in the second direction of the first line part extends in the first direction.

In this case, even if the position of the first line part is offset in the second direction, it is less likely that the light transmittance of the pixel would decrease.

The active matrix substrate according to an embodiment of the present invention further includes a plurality of pixel electrodes arranged in the display region. Each of the pixel electrodes includes a first portion that contributes to display, and a second portion that does not contribute to display. The conductive unit includes a first line part, a second protection circuit, and a second line part. The first line part is connected to the first protection circuits in the display region. The second protection circuit is connected to the first line part. The second line part is connected to the second protection circuit. The first line part includes a portion that overlaps the first portion and the second portion.

In this case, even if the position of the first line part is offset in the second direction, it is less likely that the light transmittance of the pixel would decrease.

The following describes embodiments of the present invention in detail while referring to the drawings. In the drawings, identical or equivalent parts are denoted by the same reference numerals, and descriptions of the same are not repeated.

Embodiment 1

[Liquid Crystal Display Device]

The following describes a liquid crystal display device 10 as a display device according to Embodiment 1 of the present invention, while referring to FIG. 1. FIG. 1 illustrates a schematic configuration of a liquid crystal display device 10.

The liquid crystal display device 10 includes a display panel 2, a source driver 3, a gate driver 6, a display control circuit 4, and a power source 5. The display panel 2 includes an active matrix substrate 20a, a counter substrate 20b, and a liquid crystal layer (not shown) sealed between these substrates.

The active matrix substrate 20a is electrically connected to the source driver 3 and the gate driver 6. The source driver 3 and the gate driver 6 are formed on, for example, a flexible substrate. The gate driver 6 may be formed on the active matrix substrate 20a. The display control circuit 4 is electrically connected to the display panel 2, the source driver 3, the gate driver 6, and the power source 5. The display control circuit 4 outputs control signals to the source driver 3 and the gate driver 16. The control signals include, for example, a reset signal, a clock signal, and a data signal. The power source 5 is electrically connected to the display panel 2, the source driver 3, the gate driver 6, and the display control circuit 4. The power source 5 supplies a power source voltage to the display panel 2, the source driver 3, the gate driver 6, and the display control circuit 4.

[Active Matrix Substrate]

Figure 2:
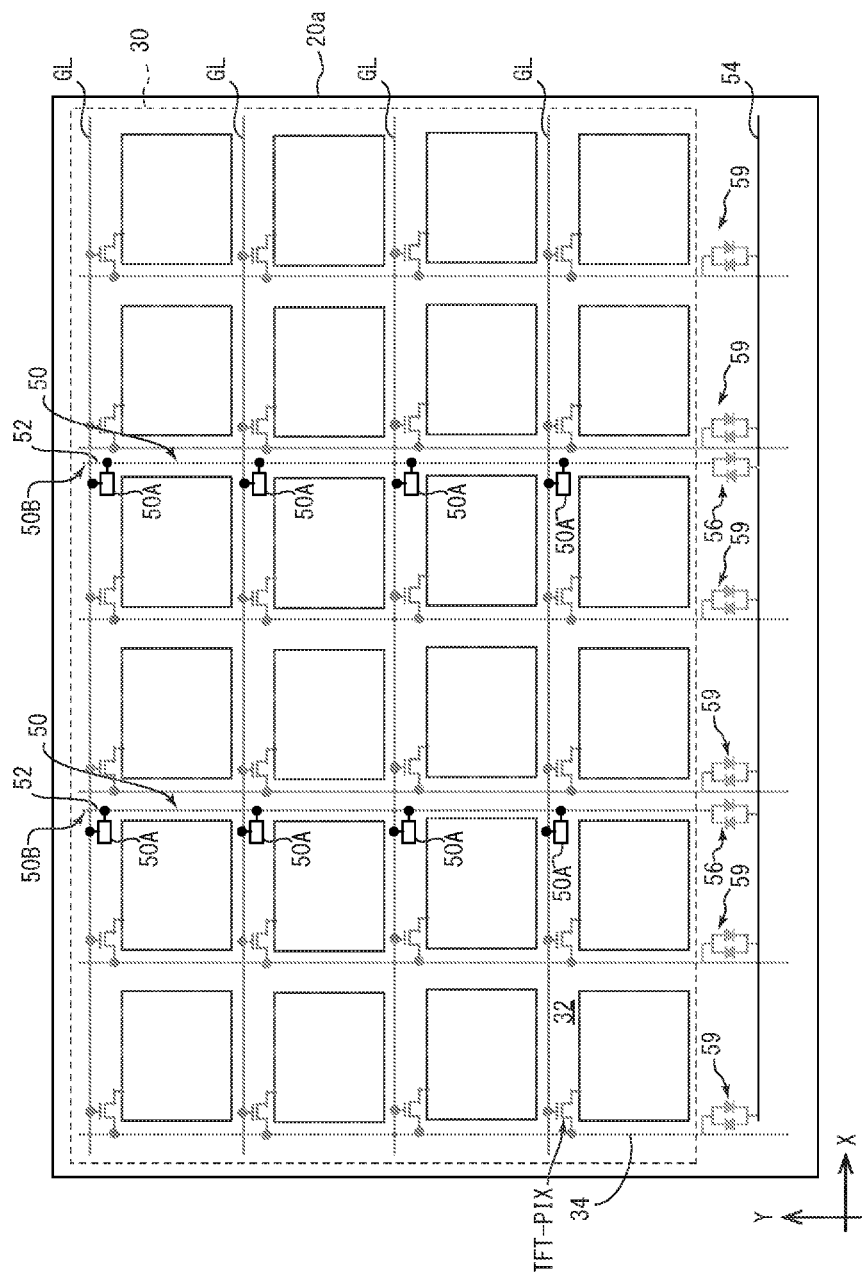
FIG. 2 is a schematic diagram illustrating one example of a schematic configuration of the active matrix substrate illustrated in FIG. 1.

The following describes the active matrix substrate 20a, while referring to FIG. 2. FIG. 2 schematically illustrates a schematic configuration of the active matrix substrate 20a.

In the active matrix substrate 20a, a plurality of gate lines GL are formed at approximately uniform intervals in the Y direction. The gate lines GL are connected to the gate driver 6.

On the active matrix substrate 20a, a plurality of source lines SL, as a plurality of data lines, are formed at approximately uniform intervals in the X direction. The source lines SL intersect with the gate lines GL. The source lines SL are connected to the source driver 3.

An area 32 enclosed by two of the gate lines GL that are adjacent to each other in the Y direction, and two of the source lines SL that are adjacent to each other in the X direction, forms one pixel. In a case where the counter substrate 20b includes color filters of, for example, three colors of red (R), green (G), and blue (B), each pixel is arranged to correspond to any one of the colors of the color filters. In other words, the display panel 2 has a display region 30 composed of a plurality of pixels.

In the area 32, pixel electrodes 34 are arranged. In other words, on the active matrix substrate 20a, a plurality of pixel electrode 34 are arranged in matrix.

In the area 32, thin film transistors as circuit elements (hereinafter referred to as TFT-PIXs) are arranged. In each TFT-PIX, a gate thereof is connected to the gate line GL. A source thereof is connected to the source line SL. A drain thereof is connected to the pixel electrode 34.

In the liquid crystal display device 10, a plurality of gate lines GL are sequentially scanned by the gate driver 6. Data signals are supplied by the source driver 3 to each source line SL. By doing so, an image is displayed on the display panel 2.

[Measurement to Static Electricity]

The following describes a protection part 50, which protects the active matrix substrate 20a, while referring to FIG. 2. In the example illustrated in FIG. 2, a plurality (two in the present embodiment) of protection parts 50 are provided, but the number of the protection part 50 may be one.

The protection part 50 includes a plurality of protection circuits 50A and a conductive unit 50B.

Each of the protection circuits 50A is arranged in the vicinities of the point of intersection between the gate line GL and the source line SL. Particularly in the present embodiment, each of the protection circuits 50A is arranged in the area 32. In other words, in each of the areas 32, one protection circuit 50A is arranged. These areas 32 are arranged in the same column. Details about the protection circuit 50A are to be described below.

The conductive unit 50B includes a protection line 52, a common line 54, and a protection circuit 56.

The protection line 52 is made of a material having conductivity. The protection line 52 may be, for example, a metal film, or a transparent conductive film. The protection line 52 is formed on the active matrix substrate 20a. The protection line 52 is formed in, for example, the same layer as that for the source line SL. The protection line 52 is formed to be parallel to the source line SL. The protection line 52 is formed over a plurality of the areas 32. In other words, the protection line 52 intersects with a plurality of the gate lines GL.

The common line 54 is made of a material having conductivity. The common line 54 is, for example, a metal film, or a transparent conductive film. The common line 54 is formed on the active matrix substrate 20a. The common line 54 is formed in a region around the display region 30. In other words, the common line 54 is formed in a frame region. The common line 54 is formed in, for example, the same layer as that for the gate line GL. The common line 54 is formed in parallel to the gate line GL.

The protection circuit 56 connects the protection line 52 and the common line 54. In the example illustrated in FIG. 2, the protection circuit 56 has such a configuration that two diodes are connected in parallel in opposite orientations, but the configuration of the protection circuit 56 is not limited to this configuration. The protection circuit 56 is formed in a region around the display region. In other words, the protection circuit 56 is formed in the frame region.

Figure 3:
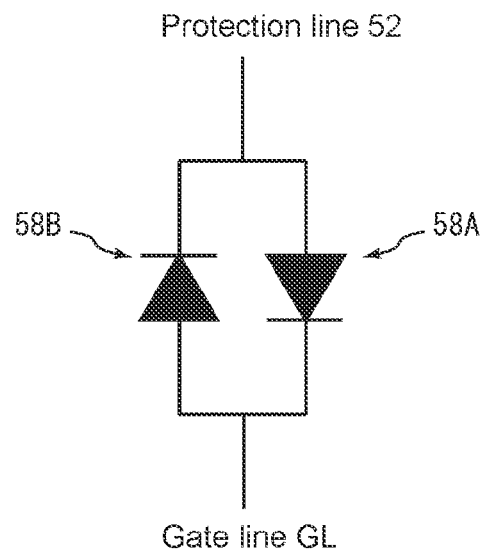
FIG. 3 is a circuit diagram of a protection circuit.
Figure 4:
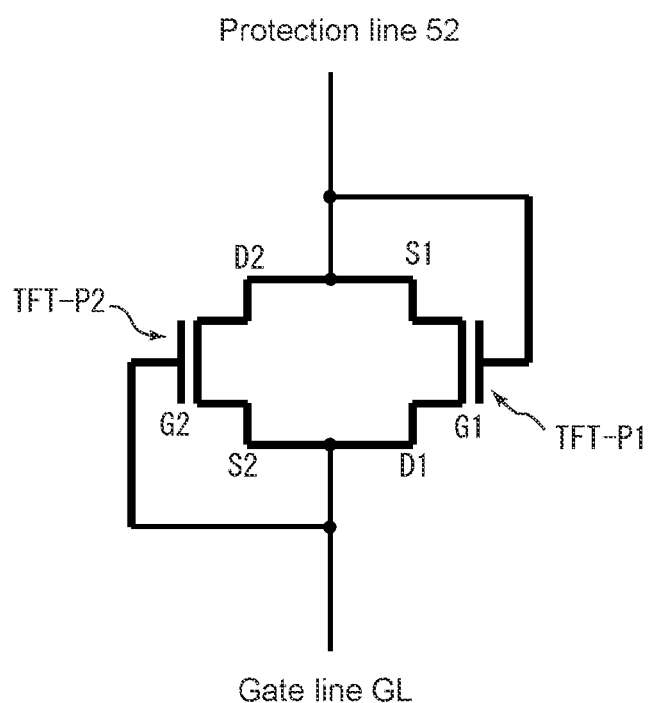
FIG. 4 is a circuit diagram of the protection circuit.
Figure 5:
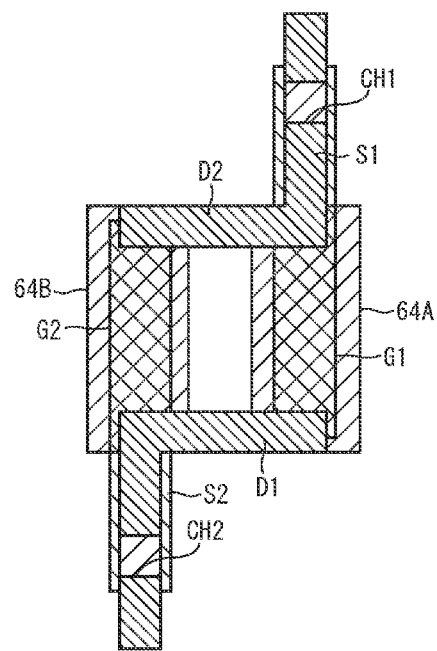
FIG. 5 is a plan view illustrating a schematic configuration of the protection circuit.
Figure 6:
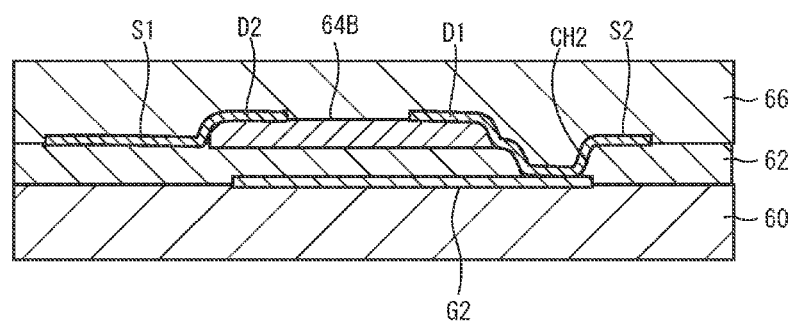
FIG. 6 is a cross-sectional view illustrating a schematic configuration of the protection circuit.

The following describes the protection circuit 50A while referring to FIGS. 3 to 6. FIGS. 3 and 4 are circuit diagrams of the protection circuit 50A. FIG. 5 is a plan view illustrating a schematic configuration of the protection circuit 50A. FIG. 6 is a cross-sectional view illustrating a schematic configuration of the protection circuit 50A.

As illustrated in FIG. 3, the protection circuit 50A includes diodes 58A and 58B. The diode 58B is arranged in parallel to the diode 58A, and is connected in the orientation opposite to that for the diode 58A.

With the configuration illustrated in FIG. 4, the diode 58A and the diode 58B are realized. The protection circuit 50A includes two thin film transistors (hereinafter referred to as a TFT-P1 and a TFT-P2). The TFT-P1 and the TFT-P2 are arranged in parallel.

In the TFT-P1, a source S1 is connected to a gate G1. In other words, the gate G1 and the source S1 are short-circuited. The point is that the gate G1 and the source S1 are diode-connected. With this, the diode 58A is realized. The source S1 is connected to the protection line 52. A drain D1 thereof is connected to the gate line GL.

In the TFT-P2, a source S2 is connected to a gate G2. In other words, the gate G2 and the source S2 are short-circuited. The point is that the gate G2 and the source S2 are diode-connected. With this, the diode 58B is realized. The source S2 is connected to the gate line GL. A drain D2 thereof is connected to the protection line 52.

As illustrated in FIGS. 5 and 6, the gate G1 and the gate G2 are formed in contact with a base substrate 60. The base substrate 60 is included in the active matrix substrate 20a. The gate G1 and the gate G2 are arranged so as to be separated from each other in the in-plane direction of the base substrate 60, and are parallel to each other, as illustrated in FIG. 5. The gate G1 and the gate G2 may be, for example, metal films, or alternatively, transparent conductive films.

The gate G1 and the gate G2 are covered with an insulating layer 62. The insulating layer 62 may be, for example, a silicon oxide film, or alternatively, a silicon nitride film.

A semiconductor layer 64A and a semiconductor layer 64B are formed in contact with the insulating layer 62. The semiconductor layer 64A and the semiconductor layer 64B are made of, for example, amorphous silicon. The semiconductor layer 64A and the semiconductor layer 64B form channels. The semiconductor layer 64A and the semiconductor layer 64B are arranged so as to be separated from each other in the in-plane direction of the base substrate 60, and are parallel to each other, as illustrated in FIG. 5. The semiconductor layer 64A overlaps the gate G1 when viewed in a plan view. The semiconductor layer 64B overlaps the gate G2 when viewed in a plan view, as illustrated in FIG. 5.

The source S1 and the source S2 are formed in contact with the semiconductor layers 64A, 64B, and the insulating layer 62. The source S1 and the source S2 may be, for example, metal films, or alternatively, transparent conductive films. As illustrated in FIG. 5, a part of the source S1 overlaps the gate G1. A part of the source S2 overlaps the gate G2. In the insulating layer 62, in an area where the source S1 and the gate G1 overlap, a contact hole CH1 is formed. In the insulating layer 62, in an area where the source S2 and the gate G2 overlap, a contact hole CH2 is formed. Via the contact hole CH1, the source S1 is connected to the gate S1. Via the contact hole CH2, the source S2 is connected to the gate S2. The source S1 is connected to the drain D2. The drain D2 overlaps the semiconductor layer 64A and the semiconductor layer 64B, when viewed in a plan view, as illustrated in FIG. 5. The source S2 is connected to the drain D1. The drain D1 overlaps the semiconductor layer 64A and the semiconductor layer 64B, when viewed in a plan view, as illustrated in FIG. 5.

The source S1 and the source S2 are covered with an insulating layer 66. The insulating layer 66 may be, for example, a silicon oxide film, or alternatively, a silicon nitride film.

To the gate G1, the gate line GL is connected. To the source S2, the protection line 52 is connected.

[Operation of Protection Part]

The protection part 50 protects the active matrix substrate 20a from static electricity when, for example, the active matrix substrate 20a is manufactured. More details are as follows.

A case is assumed in which static electricity causes the potential of the gate line GL to change in the plus direction. In this case, the potential of the gate G2 increases. This causes the TFT-P2 to be turned ON. Consequently, electric current flows from the gate line GL to the protection line 52, which causes the potential of the gate line GL to decrease. In other words, the potential of the gate line GL approaches to a predetermined potential (for example, the potential before the change).

A case is assumed in which static electricity causes the potential of the gate line GL to change in the minus direction. In this case, the potential of the gate G1 increases to a relatively high level. This causes the TFT-P1 to be turned ON. Consequently, electric current flows from the gate line GL to the protection line 52, which causes the potential of the gate line GL to decrease. In other words, the potential of the gate line GL approaches to the predetermined potential (for example, the potential before the change).

It should be noted that in a case where a signal (gate selection signal) that indicates that the gate line GL is selected by the gate driver 6 flows through the gate line GL, the potential of the gate line GL increases, but the TFT-P2 is not turned ON. In other words, the gate selection signal flows through only the gate line GL, and does not flow through the protection line 52 and the common line 54.

As mentioned above, electric current caused by static electricity flows from the gate line GL to the protection line 52. The electric current having flown from the gate line GL to the protection line 52 (electric current caused by static electricity) flows via the protection circuit 56 to the common line 54.

As illustrated in FIG. 2, the protection circuit 56 has such a configuration that two diodes are arranged in parallel, and are connected in opposite orientations. As the configuration of the protection circuit 56, for example, a configuration illustrated in FIG. 4 can be used. In this case, the protection circuit 56 operates in the same manner as the protection circuit 50A does.

Here, the source line SL is connected via a protection circuit 59 to the common line 54, as illustrated in FIG. 4. The protection circuit 59 has such a configuration that two diodes are arranged in parallel, and are connected in opposite orientations, as illustrated in FIG. 2. As the configuration of the protection circuit 59, for example, the configuration illustrated in FIG. 4 can be used. In this case, the protection circuit 59 operates in the same manner as the protection circuit 50A does. In a case where static electricity causes the potential of the source line SL to change, as is the case with the gate line GL, electric current caused by static electricity flows from the source line SL to the common line 54. This causes all of the gate lines GL and all of the source lines SL to have the same potential. Consequently, for example, discharge at points of intersection between the gate lines GL and the source lines SL, or discharge at the THT-PIX, caused by static electricity, can be suppressed; in other words, the active matrix substrate 20a can be protected from electrostatic breakdown.

In the liquid crystal display device 10, the protection circuits 50A are arranged in the display region 30. This makes it possible to decrease the width of the frame region, as compared with the case where the protection circuits 50A are arranged in the frame region.

[Application Example of Embodiment 1]

Figure 2A:
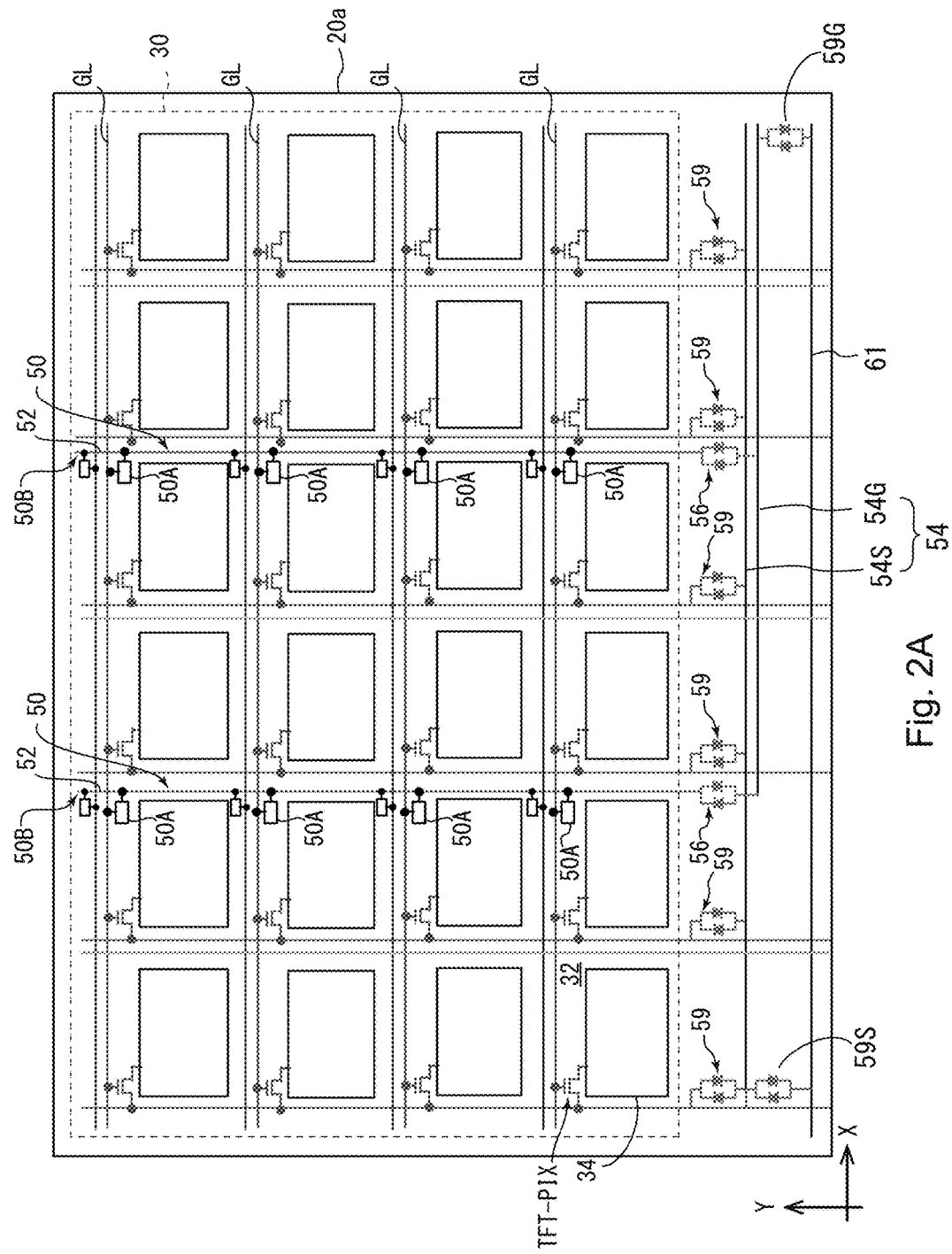
FIG. 2A is a schematic diagram illustrating another example of a schematic configuration of the active matrix substrate illustrated in FIG. 1.

The configuration may be such that, as illustrated in FIG. 2A, the gate line GL is connected via the protection circuit 56 to the common line 54G, and the source line SL is connected via the protection circuit 59 to the common line 54S. The common line 54G may be connected via the protection circuit 59G to the common electrode 61. The common line 54S may be connected via the protection circuit 59S to the common electrode 61.

[Application Example 1 of Protection Circuit]

Figure 7A:
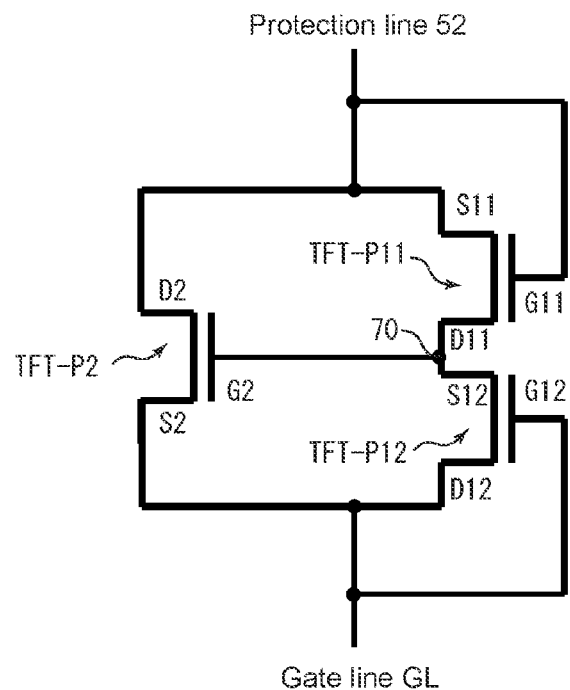
FIG. 7A is a circuit diagram of a protection circuit according to Application Example 1.

The following describes Application Example 1 of the protection circuit arranged in the display region 30, while referring to FIG. 7A. A protection circuit 50A1 according to Application Example 1 is identical to the protection circuit 50A except that the TFT-P1 is composed of two thin film transistors (hereinafter referred to as a TFT-P11 and a TFT-P12).

The TFT-P11 and the TFT-P12 are connected in series. Between the TFT-P11 and the TFT-P12, an electric conductor 70 is arranged. The drain D11 of the TFT-P11 is connected to the conductor 70. The source S11 of the TFT-P12 is connected to the conductor 70. The source S11 of the TFT-P11 is connected to the protection line 52. The drain D12 of the TFT-P12 is connected to the gate line GL. The gate G11 of the TFT-P11 is connected to the protection line 52. The gate G12 of the TFT-P12 is connected to the gate line GL.

The protection circuit 50A1 according to Application Example 1 is identical to the protection circuit 50A except that the gate G2 of the TFT-P2 is connected to the conductor 70.

The operation of the protection circuit 50A1 is as follows.

A case is assumed in which static electricity causes the potential of the gate line GL to change in the plus direction. In this case, the potential of the gate G12 increases. This causes the TFT-P12 to be turned ON. Consequently, the potential of the gate G2 increases.

Here, the gate G11 is connected to the protection line 52. The potential of the gate G11 therefore does not increase. Consequently, the state in which the potential of the gate G2 is high is maintained.

In this way, the increase of the potential of the gate G2 causes the TFT-P2 to be turned ON. Consequently, electric current flows from the gate line GL to the protection line 52, which causes the potential of the gate line GL to decrease.

[Application Example 2 of Protection Circuit]

Figure 7B:
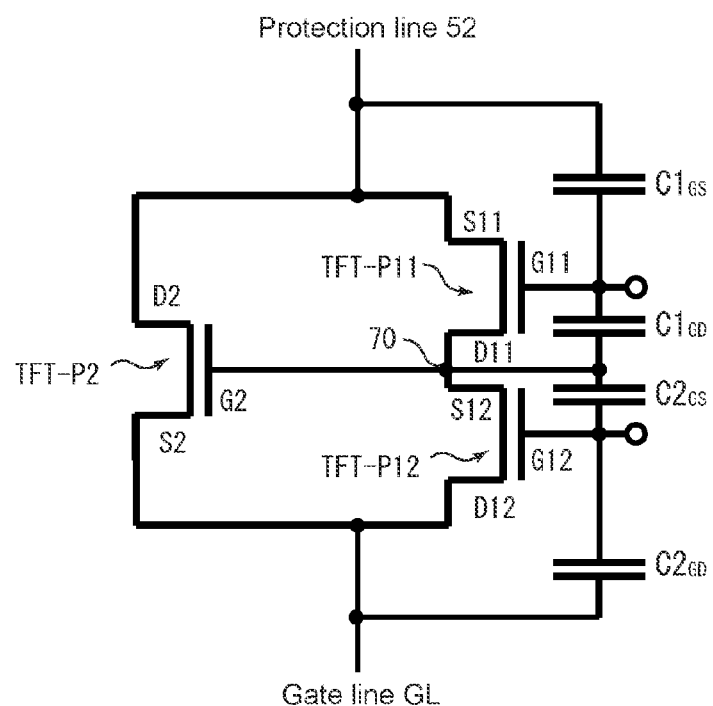
FIG. 7B is a circuit diagram of a protection circuit according to Application Example 2.

The following describes Application Example 2 of the protection circuit arranged in the display region 30, while referring to FIG. 7B. A protection circuit 50A2 according to Application Example 2 is identical to the protection circuit 50A1 except that the gate G11 and the gate G12 are electrically isolated. In other words, the gate G11 and the gate G12 are connected to no conductor.

The operation of the protection circuit 50A2 is as follows.

A case is assumed in which static electricity causes the potential of the gate line GL to change in the plus direction. In this case, the potentials of the gate G11 and the gate G12 increase due to parasitic capacitances $C1_{GS}$, $C1_{GD}$, $C2_{GS}$, and $C2_{GD}$. This causes the TFT-P11 and the TFT-P12 to be turned ON. Consequently, the potential of the conductor 70 increases. In this way, the increase of the potential of the conductor 70 causes the TFT-P2 to be turned ON. Consequently, electric current flows from the gate line GL to the protection line 52, and the potential of the gate line GL decreases.

[Application Example 3 of Protection Circuit]

Figure 7C:
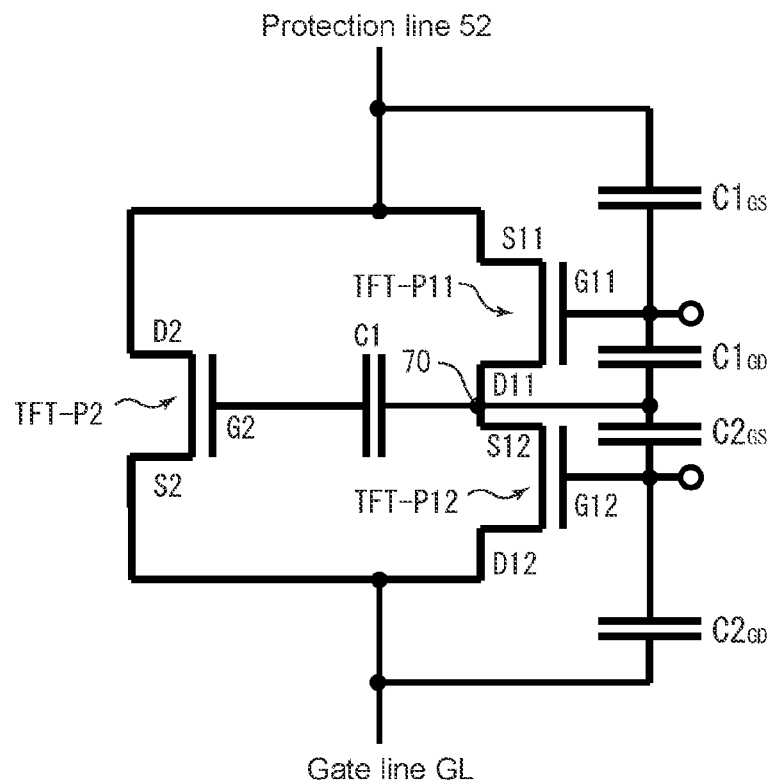
FIG. 7C is a circuit diagram of a protection circuit according to Application Example 3.

The following describes Application Example 3 of the protection circuit arranged in the display region 30, while referring to FIG. 7C. The protection circuit 50A3 according to Application Example 3 is identical to the protection circuit 50A2 except that a capacitor C1 is arranged between the gate G2 of the TFT-P2 and the conductor 70.

The protection circuit 50A3 operates in the same manner as the protection circuit 50A2. Here, in the protection circuit 50A3, the capacitor C1 is arranged. This makes it possible to elongate the duration while the state where the TFT-P1 is ON is maintained, for a time required for charging/discharging of the capacitor C1.

[Application Example 4 of Protection Circuit]

Figure 7D:
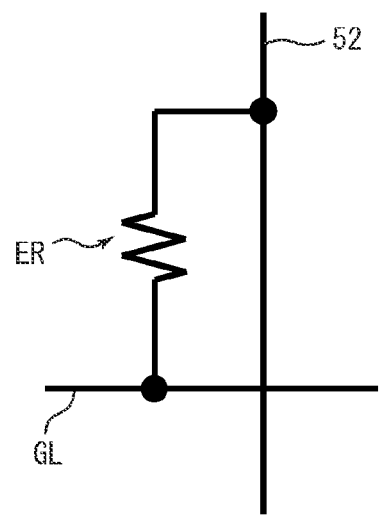
FIG. 7D is a circuit diagram of a protection circuit according to Application Example 4.

The following describes Application Example 4 of the protection circuit arranged in the display region 30, while referring to FIG. 7D. The protection circuit 50A4 according to Application Example 4 is realized by a resistance ER arranged between the gate line GL and the protection line 52.

Figure 8A:
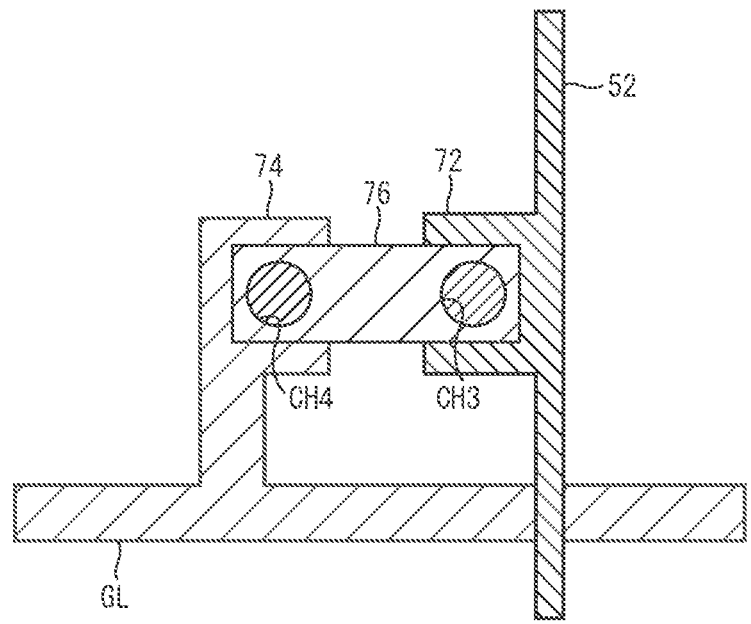
FIG. 8A is a plan view illustrating a schematic configuration of a protection circuit according to Application Example 4.
Figure 8B:
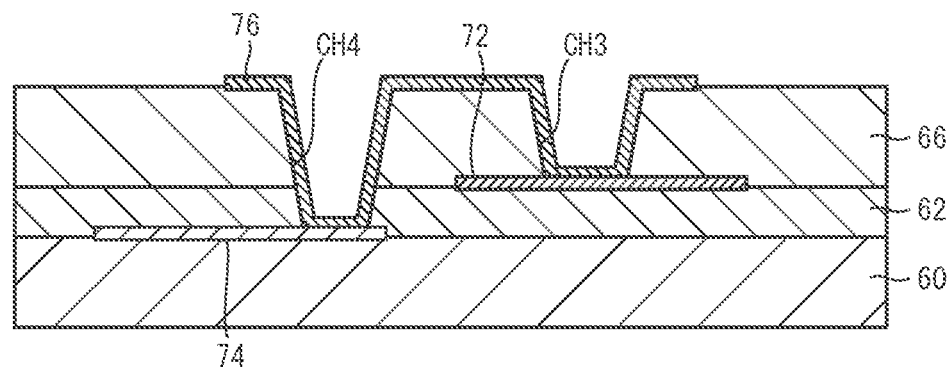
FIG. 8B is a cross-sectional view illustrating a schematic configuration of the protection circuit according to Application Example 4.

The following describes the resistance ER, while referring to FIGS. 8A and 8B. The gate line GL is formed in contact with the base substrate 60. The gate line GL is, for example, a metal film. The gate line GL includes an extension part 74.

The gate line GL is covered with the insulating layer 62. The protection line 52 is formed in contact with the insulating layer 62. The protection line 52 is, for example, a metal film. The protection line 52 includes an extension part 72. The protection line 52 is covered with the insulating layer 64.

A connection line 76 is formed in contact with the insulating layer 64. The connection line 76 is, for example, a transparent conductive film. As illustrated in FIG. 8A, the connection line 76 overlaps the extension part 72 and the extension part 74.

In the insulating layer 64, in an area where the connection line 76 overlaps the extension part 72, and in an area where the connection line 76 overlaps the extension part 74, the contact holes CH3, CH4 are formed, respectively. Via the contact hole CH3, the connection line 76 is connected to the extension part 72. Via the contact hole CH4, the connection line 76 is connected to the extension part 74.

The resistance ER is realized by a contact resistance between the connection line 76 and the extension part 72, and a contact resistance between the connection line 76 and the extension part 74.

To increase the resistance ER, for example, the contact resistance between the connection line 76 and the extension part 72 may be increased.

Figure 8C:
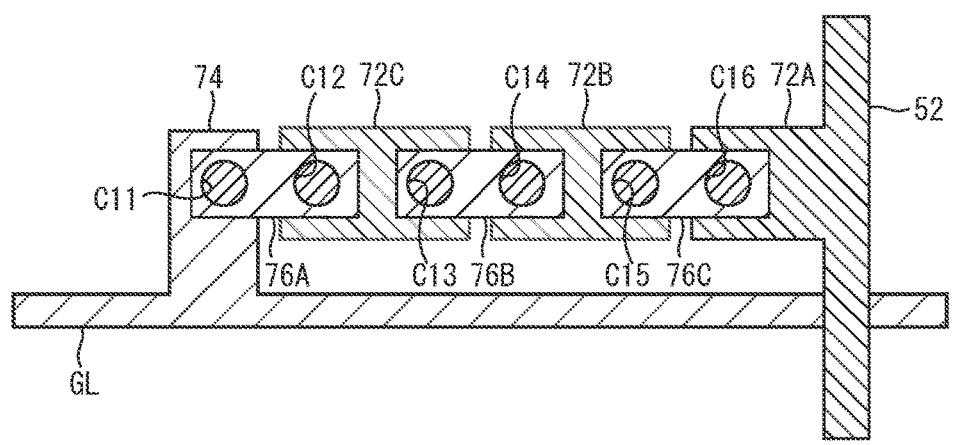
FIG. 8C is a plan view illustrating a schematic configuration of a modification of the protection circuit according to Application Example 4.

With reference to FIG. 8C, the extension part 72 is composed of a plurality (three in the present embodiment) of extension parts 72A, 72B, and 72C. The extension part 72A is connected to the protection line 52. The extension part 72B is positioned adjacent to the extension part 72A, with a predetermined clearance provided therebetween. The extension part 72C is positioned adjacent to the extension part 72B, with a predetermined clearance provided therebetween. The extension part 72A, the extension part 72B, and the extension part 72C are formed in the same layer.

With reference to FIG. 8C, the connection line 76 is composed of a plurality (three in the present embodiment) of connection lines 76A, 76B, and 76C. The connection line 76A overlaps the extension part 74 and the extension part 72C. The connection line 76B is positioned adjacent to the connection line 76A, with a predetermined clearance provided therebetween. The connection line 76B overlaps the extension part 72C and the extension part 72B. The connection line 76C is positioned adjacent to the connection line 76B, with a predetermined clearance provided therebetween. The connection line 76C overlaps the extension part 72B and the extension part 72A. The connection line 76A, the connection line 76B, and the connection line 76C are formed in the same layer.

In the insulating layer 64, the contact holes CH11 to CH16 are formed in the following areas, respectively: an area where the connection line 76A overlaps the extension part 74; an area where the connection line 76A overlaps the extension part 72C; an area where the connection line 76B overlaps the extension part 72C; an area where the connection line 76B overlaps the extension part 72B; an area where the connection line 76A overlaps the extension part 72B; and an area where the connection line 76A overlaps the extension part 72A. Via the contact hole CH11, the connection line 76A is connected to the extension part 74. Via the contact hole CH12, the connection line 76A is connected to the extension part 72C. Via the contact hole CH13, the connection line 76B is connected to the extension part 72C. Via the contact hole CH14, the connection line 76B is connected to the extension part 72B. Via the contact hole CH15, the connection line 76A is connected to the extension part 72B. Via the contact hole CH16, the connection line 76A is connected to the extension part 72A.

In the example illustrated in FIG. 8C, the resistance ER is realized by the following contact resistances: a contact resistance between the connection line 76A and the extension part 74; a contact resistance between the connection line 76A and the extension part 72C; a contact resistance between the connection line 76B and the extension part 72C; a contact resistance between the connection line 76B and the extension part 72B; a contact resistance between the connection line 76A and the extension part 72B; and a contact resistance between the connection line 76A and the extension part 72A. By setting the magnitude of each contact resistance appropriately, therefore, the resistance ER can be increased further, as compared with the example illustrated in FIG. 8A.

[Relationship Between Pixel Electrode and Protection Line]

As mentioned above, the protection line 52 is formed over a plurality of the areas 32. It is therefore necessary to suppress the reduction of the light transmittance of the pixel caused by the provision of the protection line 52. The following description described the relationship between the pixel electrode 34 and the protection line 52 regarding each operation mode of liquid crystal. It should be noted that the shape of the pixel electrode 34 described below is merely one example.

[MVA Mode]

Figure 9:
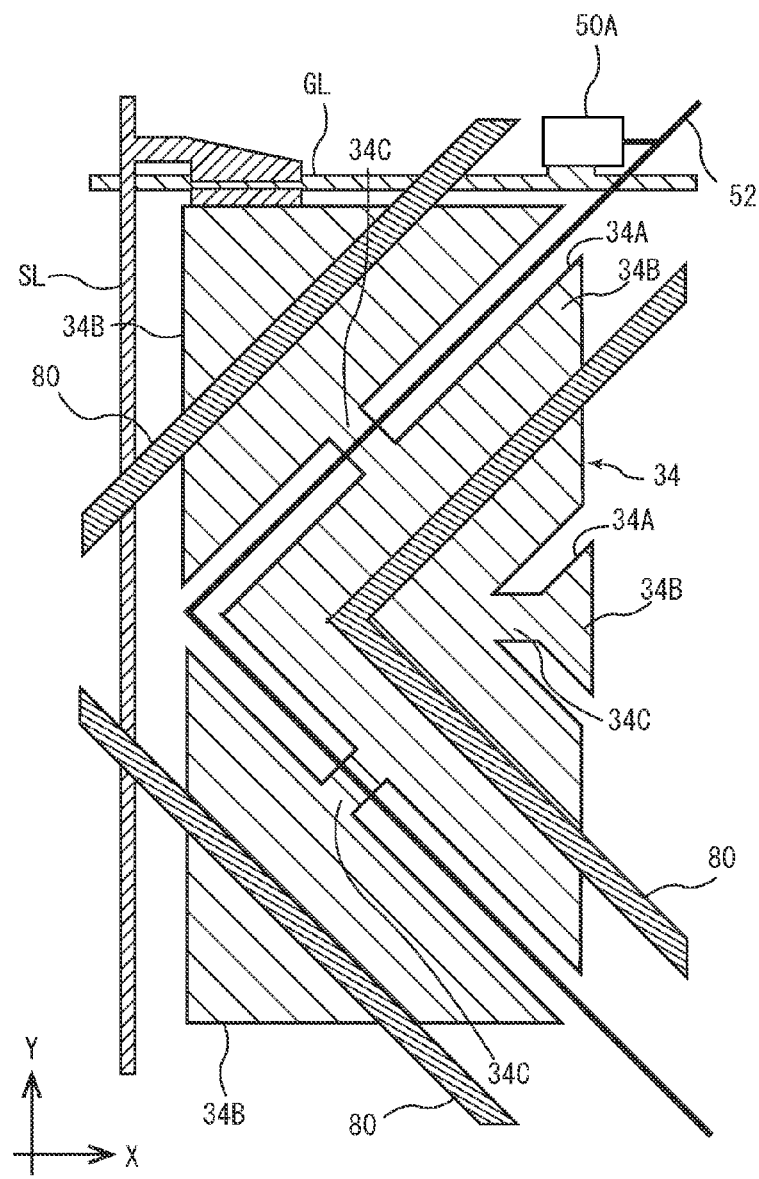
FIG. 9 is a plan view illustrating one example of relationship between a pixel electrode and a protection line in a case where the operation mode of liquid crystal is the MVA mode.

FIG. 9 illustrates one example of the relationship between the pixel electrode 34 and the protection line 52 in a case where the operation mode of liquid crystal is the multi domain vertical alignment (MVA) mode. In the example illustrated in FIG. 9, the pixel electrode 34 has a plurality of slits 34A. This allows the pixel electrode 34 to have a plurality of electrode portions 34B. Two adjacent electrode portions 34B, 34B are linked by a connecting part 34C. Each of the slits 34A is, when viewed in a plan view, formed at a position different from the positions of a plurality of ribs 80 provided on the counter substrate 20b. The slits 34A and the ribs 80 are positioned at boundaries between the alignments of liquid crystal molecules. At the positions where the slits 34A and the ribs 80 are formed, therefore, the light transmittance is low. In other words, the slits 34A and the rib 80 are portions that do not contribute to display.

In the example illustrated in FIG. 9, the protection line 52 is arranged at positions where the slits 34A are formed. As mentioned above, at the positions where the slits 34A are formed, the light transmittance is low. This makes it possible to suppress the reduction of the light transmittance of the pixel caused by the protection line 52.

Figure 9A:
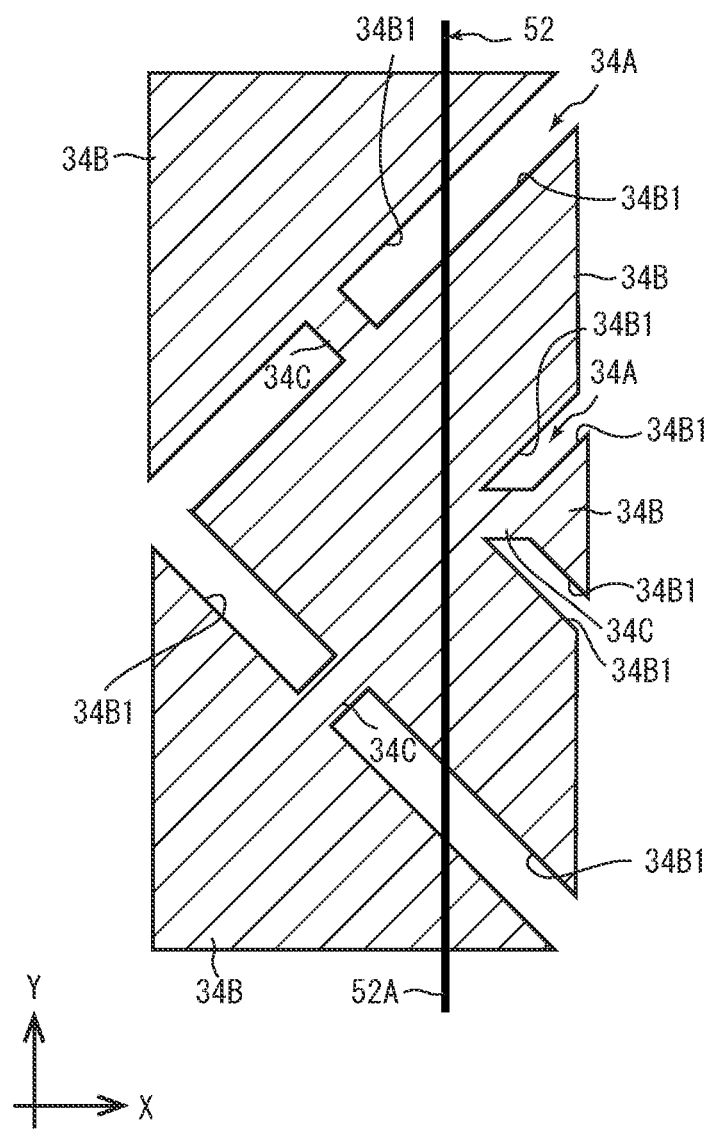
FIG. 9A is a plan view illustrating another example of relationship between a pixel electrode and a protection line in a case where the operation mode of liquid crystal is the MVA mode.

In the example illustrated in FIG. 9, the light transmittance of the pixel in a case where the protection line 52 is formed at positions where the slits 34 are formed, and the light transmittance of the pixel in a case where the protection line 52 is offset from the positions of the slits 34, are different. Then, as illustrated in FIG. 9A, an edge 52A in X direction of the protection line 52 is caused to intersect with the edges 34B1 in the X direction of the electrode portions 34B. This makes it less likely that the light transmittance of the pixel would vary, even if the position of the protection line 52 is offset in the X direction. It should be noted that in the example illustrated in FIG. 9A, the illustration of the ribs 80 is omitted.

[PVA Mode]

Figure 10:
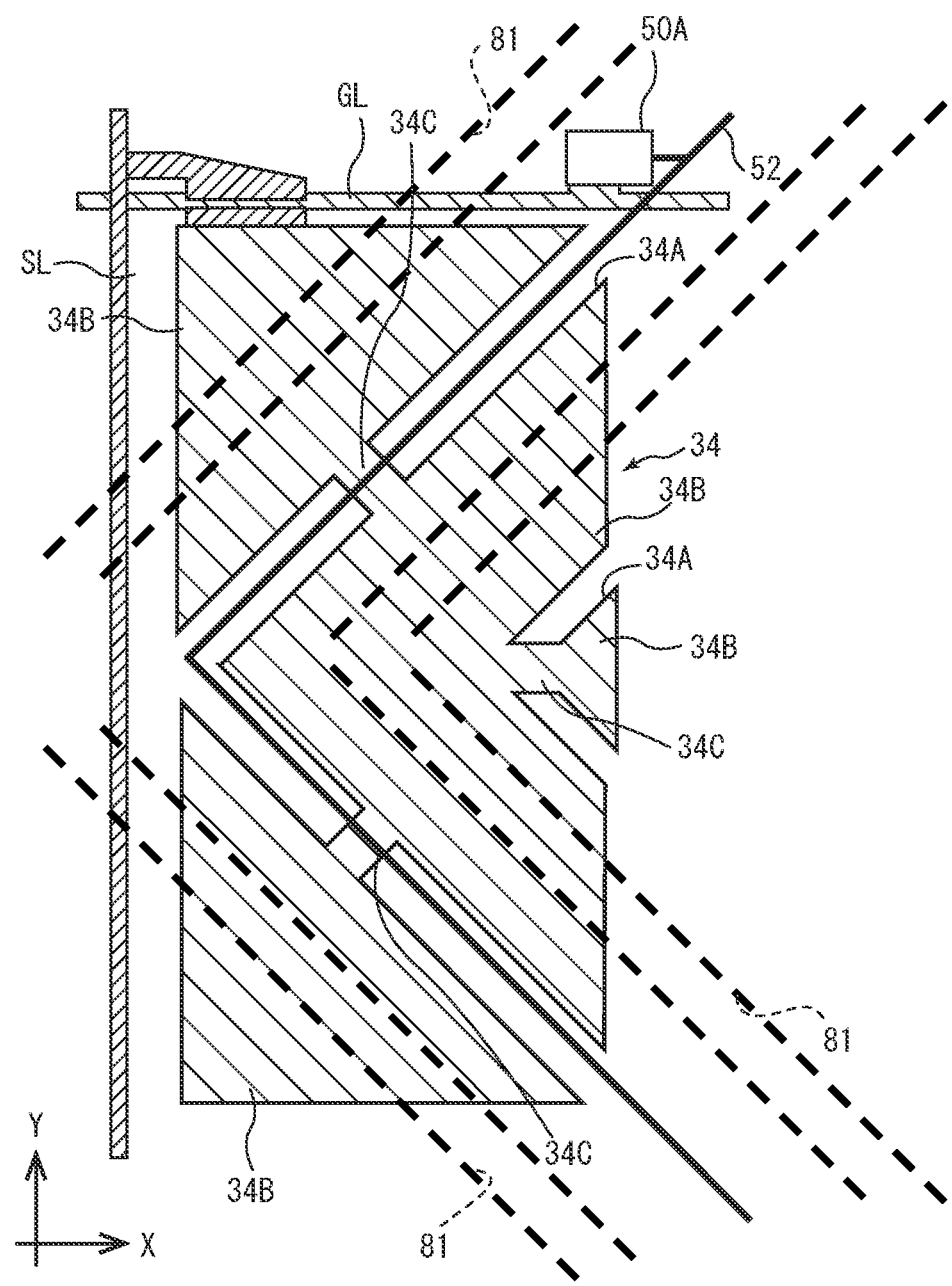
FIG. 10 is a plan view illustrating one example of relationship between a pixel electrode and a protection line in a case where the operation mode of liquid crystal is the PVA mode.

FIG. 10 illustrates one example of the relationship between the pixel electrode 34 and the protection line 52 in a case where the operation mode of liquid crystal is the patterned vertical alignment (PVA) mode. In the example illustrated in FIG. 10, the pixel electrode 34 includes a plurality of slits 34A. The pixel electrode 34 therefore includes a plurality of electrode portions 34B. Two of the electrode portions 34B that are adjacent to each other are linked by a connecting part 34C. Each of the slits 34A is formed at a position different from the positions of slits 81 provided in the counter substrate 20b, when viewed in a plan view. The slits 81 are formed in counter electrodes formed in the counter substrate 20b. The slits 34A and the slits 81 are positioned at boundaries between alignments of liquid crystal molecules. At the positions where the slits 34A and the slits 81 are formed, therefore, the light transmittance is low. In other words, the slits 34A and the slits 81 are portions that do not contribute to display.

In the example illustrated in FIG. 10, the protection line 52 is arranged at positions where the slits 34A are formed. As mentioned above, at the positions where the slits 34A are formed, the light transmittance is low. This makes it possible to suppress the reduction of the light transmittance of the pixel caused by the protection line 52.

It should be noted that, in the example illustrated in FIG. 10 as well, the protection line 52 may be arranged in the same manner as that in the case illustrated in FIG. 9A.

[PSA Mode]

Figure 11:
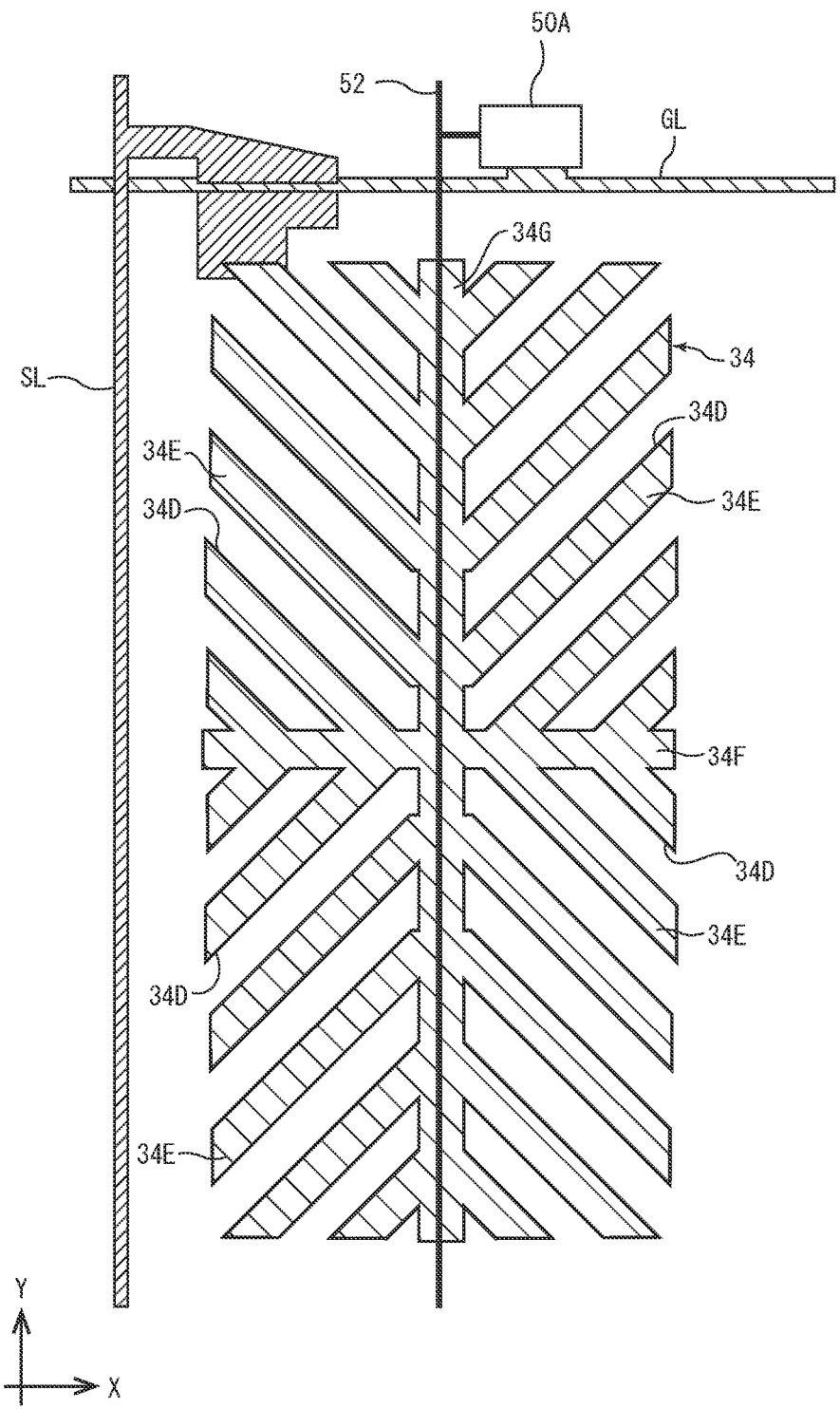
FIG. 11 is a plan view illustrating one example of relationship between a pixel electrode and a protection line in a case where the operation mode of liquid crystal is the PSA mode.

FIG. 11 illustrates one example of the relationship between the pixel electrode 34 and the protection line 52 in a case where the operation mode of liquid crystal is the polymer sustained alignment (PSA) mode. In the example illustrated in FIG. 11, the pixel electrode 34 includes a plurality of slits 34D. The pixel electrode 34, therefore, includes a plurality of electrode portions 34E, an electrode portion 34F, and an electrode portion 34G. Each of the electrode portions 34E extends in directions that intersect with the X direction and the Y direction. The electrode portion 34F extends in the X direction. The electrode portion 34G extends in the Y direction. Each of the electrode portions 34E is connected to either one of the electrode portion 34F or the electrode portion 34G. The electrode portion 34F is connected to the electrode portion 34G. The electrode portion 34F intersects with the electrode portion 34G. The electrode portion 34F and the electrode portion 34G are positioned at boundaries of the alignments of liquid crystal molecules. At the positions where the electrode portion 34F and the electrode portion 34G are formed, therefore, dark lines occur. In other words, the electrode portion 34F and the electrode portion 34G are portions that do not contribute to display.

In the example illustrated in FIG. 11, the protection line 52 is arranged at such a position that the protection line 52 overlaps the electrode portion 34G. As mentioned above, at a position where the electrode portion 34G is formed, a dark line occurs. Therefore, this makes it possible to suppress the reduction of the light transmittance of the pixel caused by the protection line 52.

Figure 11A:
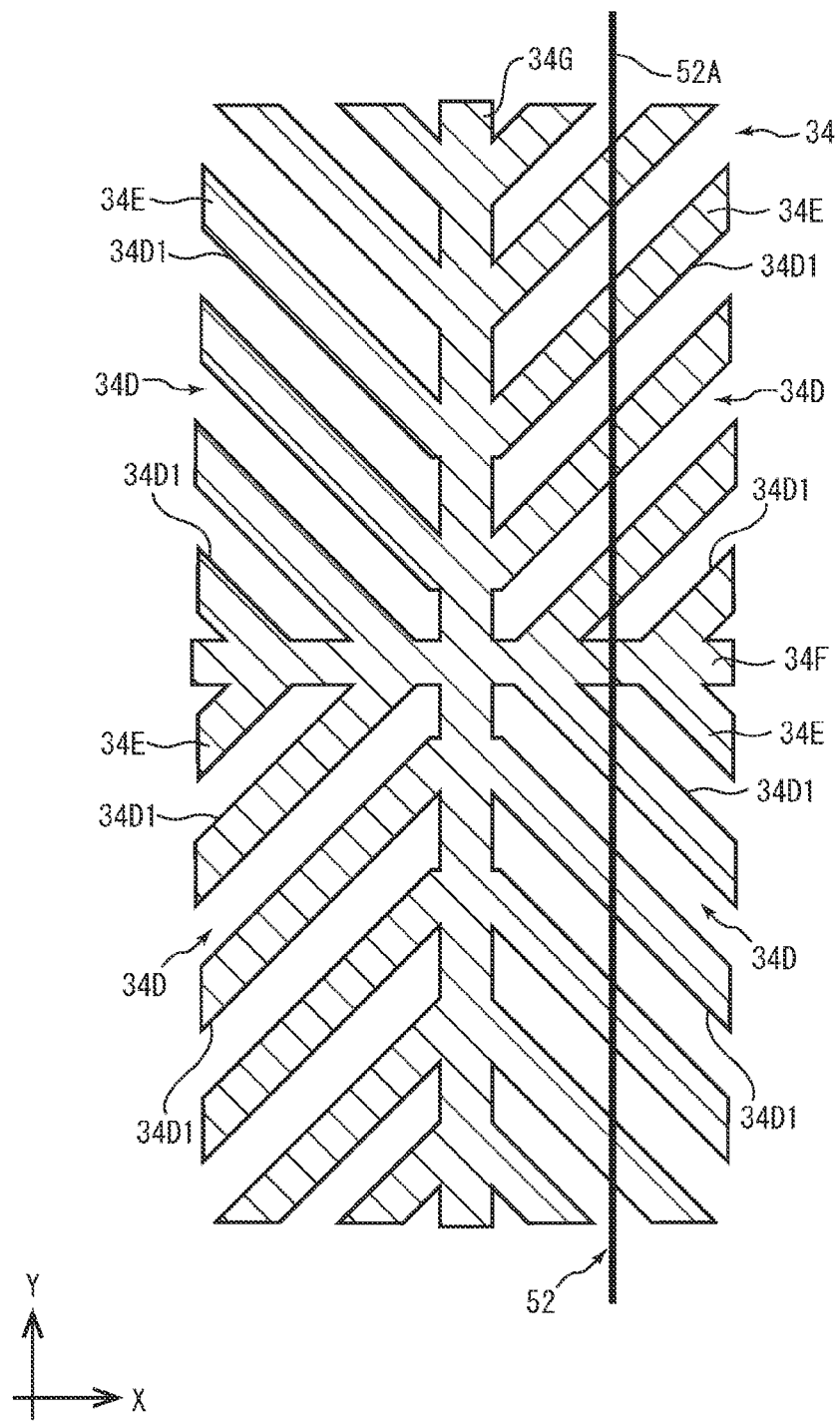
FIG. 11A is a plan view illustrating another example of relationship between a pixel electrode and a protection line in a case where the operation mode of liquid crystal is the PSA mode.

In the example illustrated in FIG. 11, the light transmittance of the pixel in a case where the protection line 52 is formed at a position of the electrode portion 34G, and the light transmittance of the pixel in a case where the protection line 52 is offset from the position of the electrode portion 34G, are different. Then, as illustrated in FIG. 11A, the edge 52A in the X direction of the protection line 52 is caused to intersect with edges 34B1 in X direction intersection of the electrode portions 34D. This makes it less likely that the light transmittance of the pixel would vary, even if the position of the protection line 52 is offset in the X direction.

[UV²A Mode]

Figure 12:
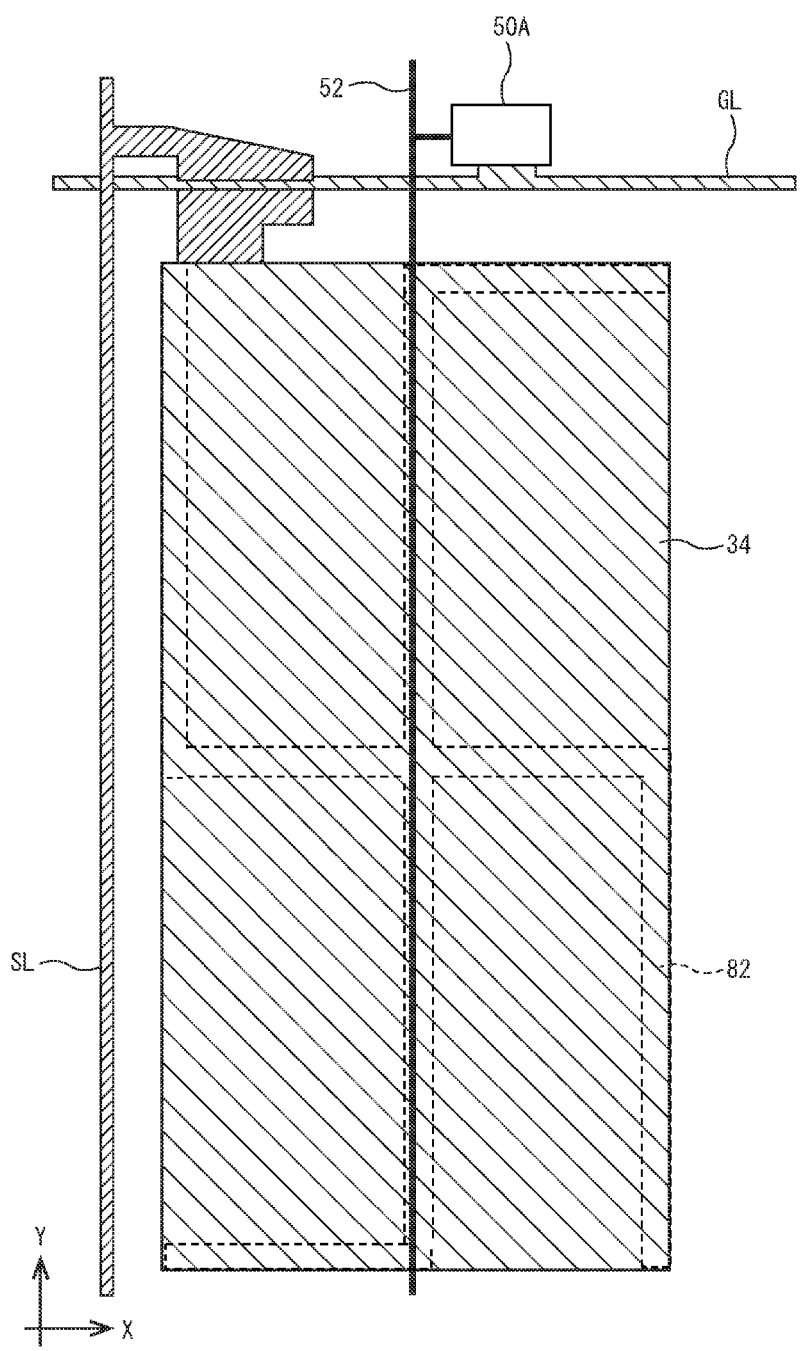
FIG. 12 is a plan view illustrating one example of relationship between a pixel electrode and a protection line in a case where the operation mode of liquid crystal is the $UV^2A$ mode.

FIG. 12 illustrates one example of the relationship between the pixel electrode 34 and the protection line 52 in a case where the operation mode of liquid crystal is the ultra-violet induced multi-domain vertical alignment (UV²A) mode. In the example illustrated in FIG. 12, at a position that overlaps the pixel electrode 34, a dark line area 82, that is, a portion that does not contribute to display, is formed. The following describes the reason for this, while referring to FIGS. 12A to 12C.

Figure 12A:
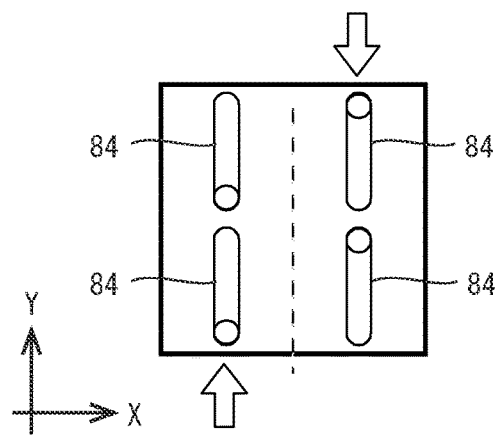
FIG. 12A is a schematic diagram illustrating an alignment direction of an alignment film on a side of an active matrix substrate in a case where the operation mode of liquid crystal is the $UV^2A$ mode, the alignment direction being an alignment direction within one pixel.

FIG. 12A illustrates an alignment direction in an alignment film on the active matrix substrate 20a side, the alignment direction being an alignment direction in one pixel. In the example illustrated in FIG. 12A, the alignment direction in the left half of one pixel, and the alignment direction in the right half thereof, are opposite. As the alignment directions are different, the directions in which tilt angles are given to the liquid crystal molecules 84 are different.

Figure 12B:
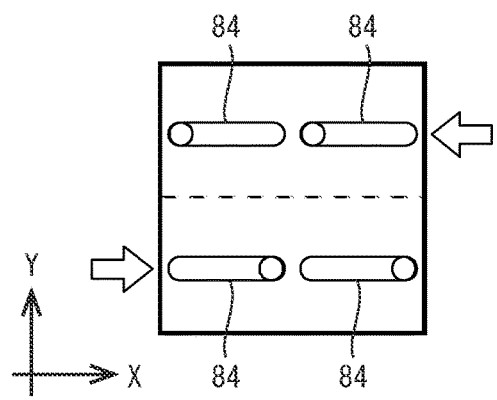
FIG. 12B is a schematic diagram illustrating an alignment direction of an alignment film on a side of a counter substrate in a case where the operation mode of liquid crystal is the $UV^2A$ mode, the alignment direction being an alignment direction within one pixel.

FIG. 12B illustrates an alignment direction in the alignment film on the counter substrate 20b side, the alignment direction being an alignment direction in one pixel. In the example illustrated in FIG. 12B, the alignment direction in the upper half of one pixel and the alignment direction in the lower half of the pixel are opposite. As the alignment directions are different, the directions in which tilt angles are given to the liquid crystal molecules 84 are different. The alignment directions of the alignment film on the counter substrate 20b side are orthogonal to the alignment directions of the alignment film on the active matrix substrate 20a side.

Figure 12C:
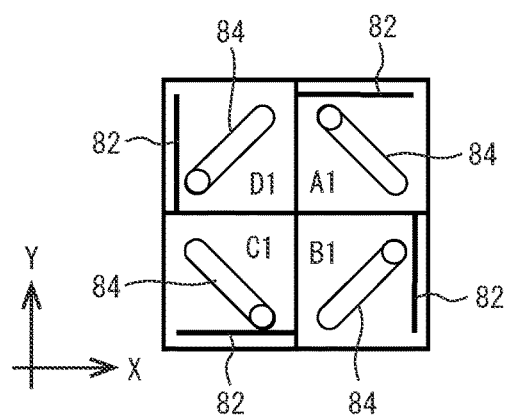
FIG. 12C is a schematic diagram illustrating an alignment direction of liquid crystal molecules when a voltage is applied in a case where the operation mode of liquid crystal is the UV²A mode, the alignment direction being an alignment direction of liquid crystal molecules within one pixel.

FIG. 12C illustrates alignment directions of the liquid crystal molecules 84 in one pixel when a voltage is applied. As illustrated in FIG. 12C, alignment directions of the liquid crystal molecules 84 in the area A1, the area B1, the area C1, and the area D1 are different. Dark line areas 82, therefore, are formed.

In the example illustrated in FIG. 12, the protection line 52 is arranged at a position overlapping the dark line area 82. This makes it possible to suppress the reduction of the light transmittance of the pixel caused by the protection line 52.

Figure 12D:
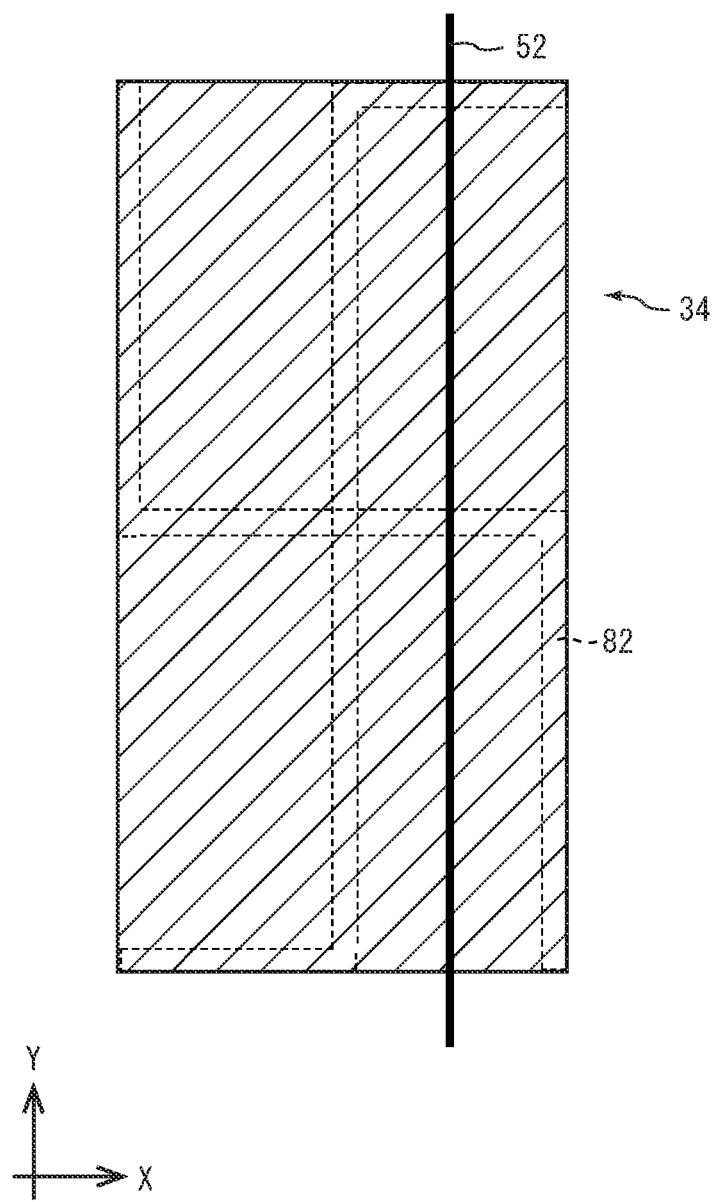
FIG. 12D is a plan view illustrating another example of relationship between a pixel electrode and a protection line in a case where the operation mode of liquid crystal is the UV²A mode.

In the example illustrated in FIG. 12, light transmittance of the pixel in a case where the protection line 52 overlaps the dark line area 82, and light transmittance of the pixel in a case where the protection line 52 does not overlap the dark line area 82, are different. Then, as illustrated in FIG. 12D, the protection line 52 is caused to overlap the dark line area 82, and an area other than the dark line area 82. In other words, the protection line 52 is caused to overlap a portion that does not contribute to display, and a portion that contributes to display. This makes it less likely that the light transmittance of the pixel would vary, even if the position of the protection line 52 is offset in the X direction.

[IPS Mode]

Figure 13:
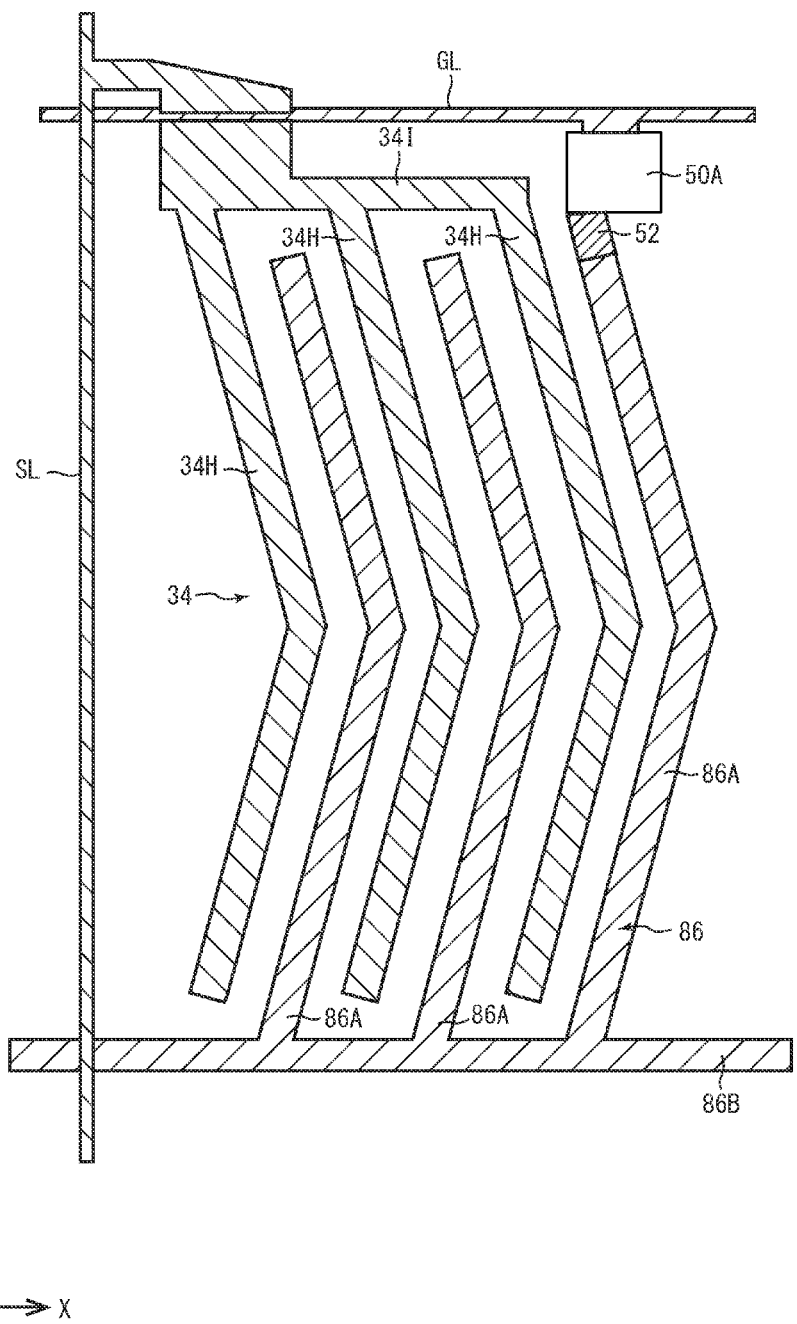
FIG. 13 is a plan view illustrating one example of relationship between a pixel electrode and a protection line in a case where the operation mode of liquid crystal is the IPS mode.

FIG. 13 illustrates one example of the relationship between the pixel electrode 34 and the protection line 52 in a case where the operation mode of liquid crystal is the in-plane switching (IPS) mode. In the example illustrated in FIG. 13, the pixel electrode 34 includes a plurality of electrode portions 34H, and a connecting part 34I. The electrode portions 34H extend in the Y direction, and are arrayed in the X direction. The connecting part 34I links ends on one side in the lengthwise direction of the electrode portions 34H.

The common electrode 86 is formed in the same layer as the gate line GL. The common electrode 86 includes a plurality of electrode portions 86A and a connecting part 86B. The electrode portions 86A extend in the Y direction, and are arrayed in the X direction. The electrode portions 86A and the electrode portions 34H are arrayed alternately when viewed in a plan view. The connecting part 86B links ends on one side in the lengthwise direction of the electrode portions 86A.

The protection line 52 connects one of the electrode portions 86A and the protection circuit 50A.

In the example illustrated in FIG. 13, the protection line 52 is formed at such a position that the protection line 52 does not overlap the pixel electrode 34 and the common electrode 86. This makes it possible to suppress the reduction of the light transmittance of the pixel caused by the protection line 52.

[FFS Mode]

Figure 14:
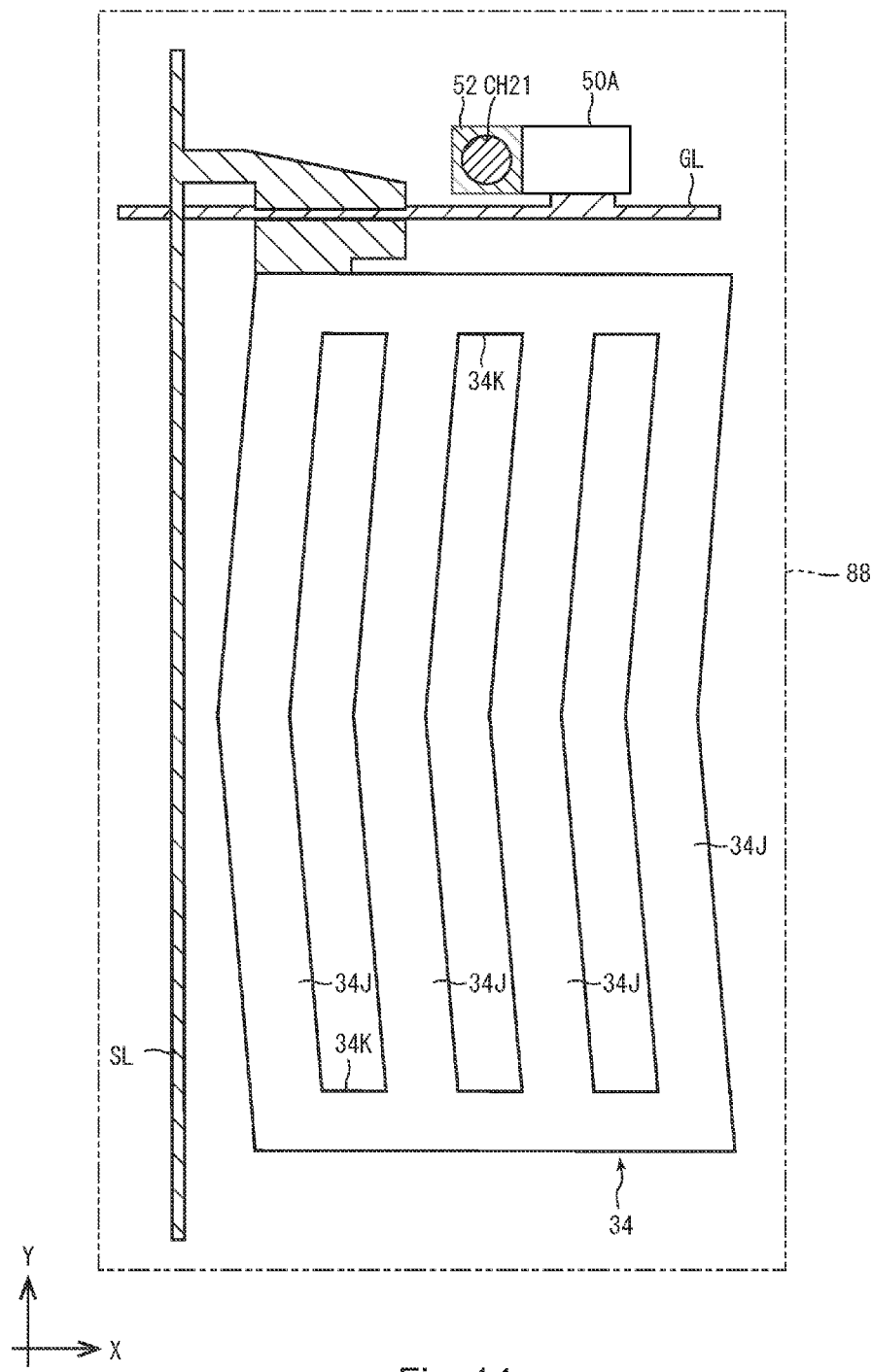
FIG. 14 is a plan view illustrating one example of relationship between a pixel electrode and a protection line in a case where the operation mode of liquid crystal is the FFS mode.

FIG. 14 illustrates one example of the relationship between the pixel electrode 34 and the protection line 52 in a case where the operation mode of liquid crystal is the fringe field switching (FFS) mode. In the example illustrated in FIG. 14, the pixel electrode 34 includes a plurality of electrode portions 34J and a pair of connecting parts 34K, 34K. The electrode portions 34J extend in the Y direction, and are arrayed in the X direction. The pair of the connecting parts 34K, 34K extend in the X direction. One of the connecting parts 34K links ends on one side in the lengthwise direction of the electrode portions 34J. The other connecting part 34K links the ends on the other side in the lengthwise direction of the electrode portions 34J. The pixel electrode 34 overlaps the common electrode 88, when viewed in a plan view. The protection line 52 is connected via the contact hole CH21 to the common electrode 88.

Figure 14A:
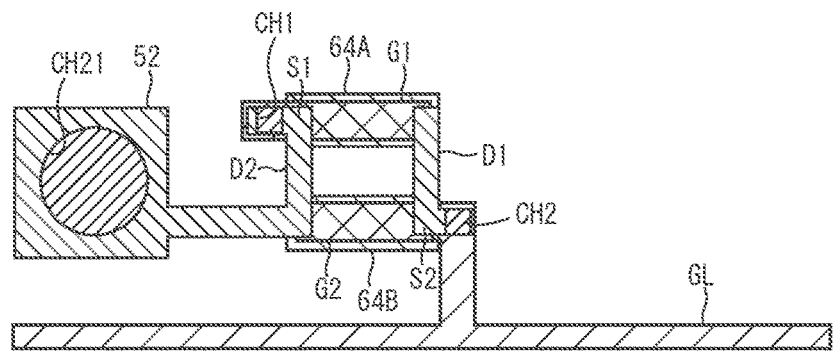
FIG. 14A is a plan view illustrating one example of relationship between a protection circuit and a protection line in a case where the operation mode of liquid crystal is the FFS mode.
Figure 14B:
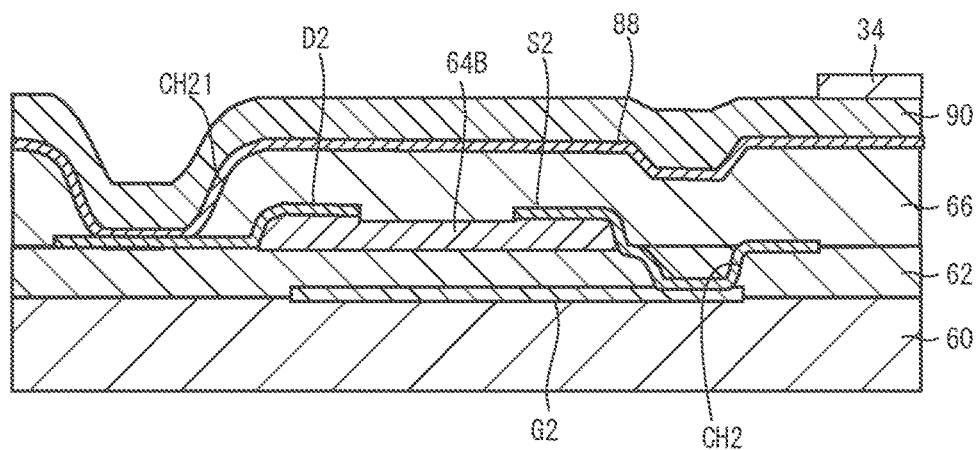
FIG. 14B is a cross-sectional view illustrating one example of relationship between a protection circuit and a common electrode in a case where the operation mode of liquid crystal is the FFS mode.

The following describes the relationship between the protection circuit 50A, the protection line 52, and the common electrode 88, while referring to FIGS. 14A and 14B. In the example illustrated in FIG. 14, the protection circuit 50A has a configuration illustrated in FIGS. 5 and 6. The description of the protection circuit 50A therefore is omitted. It should be noted that the drain D2 is connected to the source protection line 52.

The common electrode 88 is formed in contact with the insulating layer 66. The common electrode 88 is formed with, for example, a transparent conductive film. In the insulating layer 66, at a position where the protection line 52 is formed, a contact hole CH21 is formed. Via the contact hole CH21, the protection line 52 is connected to the common electrode 88.

The common electrode 88 is covered with an insulating layer 90. The insulating layer 90 may be, for example, a silicon oxide film, or alternatively, a silicon nitride film, or further alternatively, an organic resin film. The pixel electrode 34 is formed in contact with the insulating layer 90.

In the example illustrated in FIG. 14, the protection line 52 is formed at such a position that the protection line 52 does not overlap the pixel electrode 34. This makes it possible to suppress the reduction of the light transmittance of the pixel caused by the protection line 52.

Figure 15:
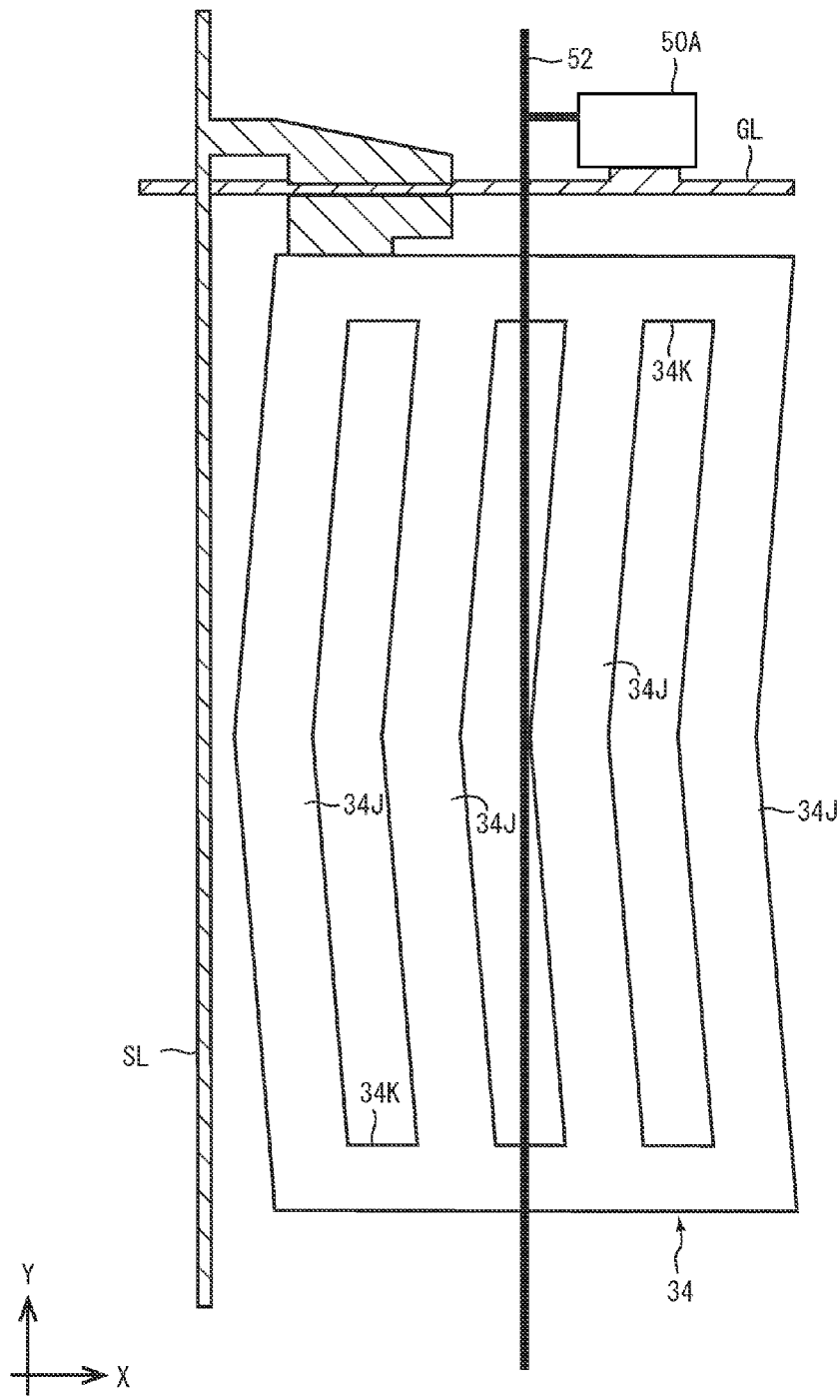
FIG. 15 is a plan view illustrating another example of relationship between a pixel electrode and a protection line in a case where the operation mode of liquid crystal is the FFS mode.

FIG. 15 illustrates another example of the relationship between the pixel electrode 34 and the protection line 52 in a case where the operation mode of liquid crystal is the FFS mode. In the example illustrated in FIG. 15, as compared with the example illustrated in FIG. 14, the protection line 52 intersects with the pixel electrode 34. In a case where, for example, the gate driver is arranged in the display region, as is the case with Embodiment 2 to be described below, a dummy line for adjusting the light transmittance of the pixel may be used as the protection line 52.

Figure 15A:
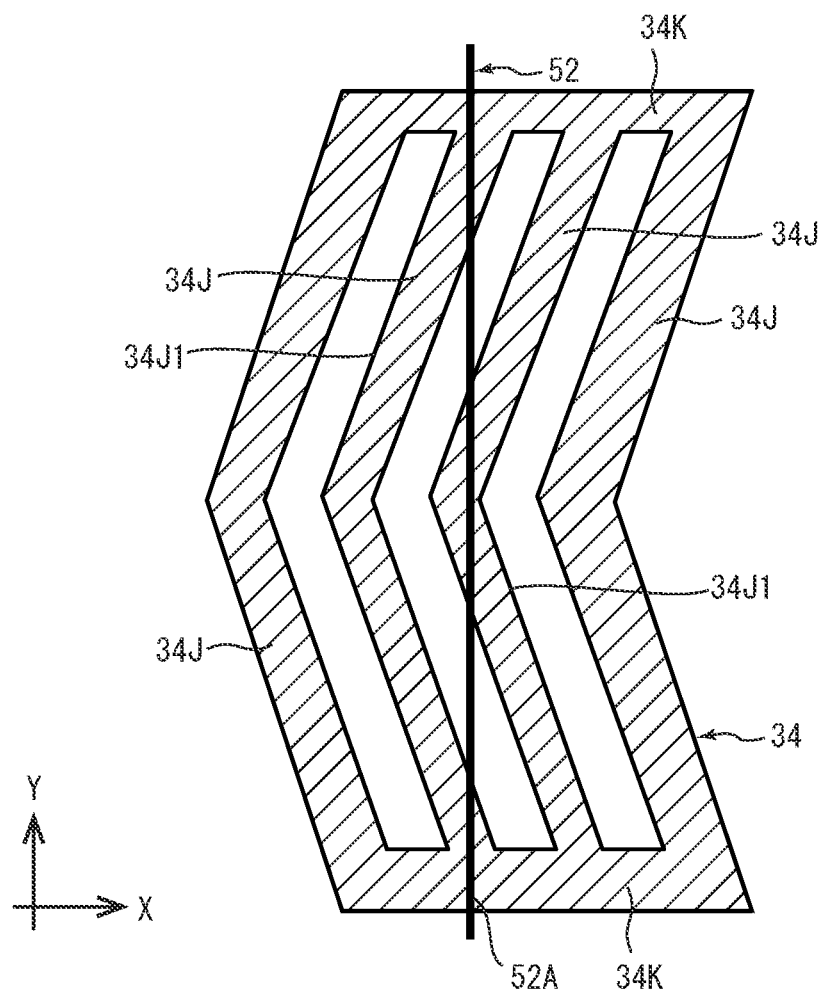
FIG. 15A is a plan view illustrating another example of relationship between a pixel electrode and a protection line in a case where the operation mode of liquid crystal is the FFS mode.

FIG. 15A illustrates another example of the relationship between the pixel electrode 34 and the protection line 52 in a case where the operation mode of the liquid crystal is the FFS mode. In the example illustrated in FIG. 15A, as compared with the example illustrated in FIG. 15, the edge 52A in the X direction of the protection line 52 is caused to intersect with edges 34J1 in the X direction of the electrode portions 34J. This makes it less likely that the light transmittance of the pixel would vary, even if the position of the protection line 52 is offset in the X direction.

Embodiment 2

[Liquid Crystal Display Device]

Figure 16:
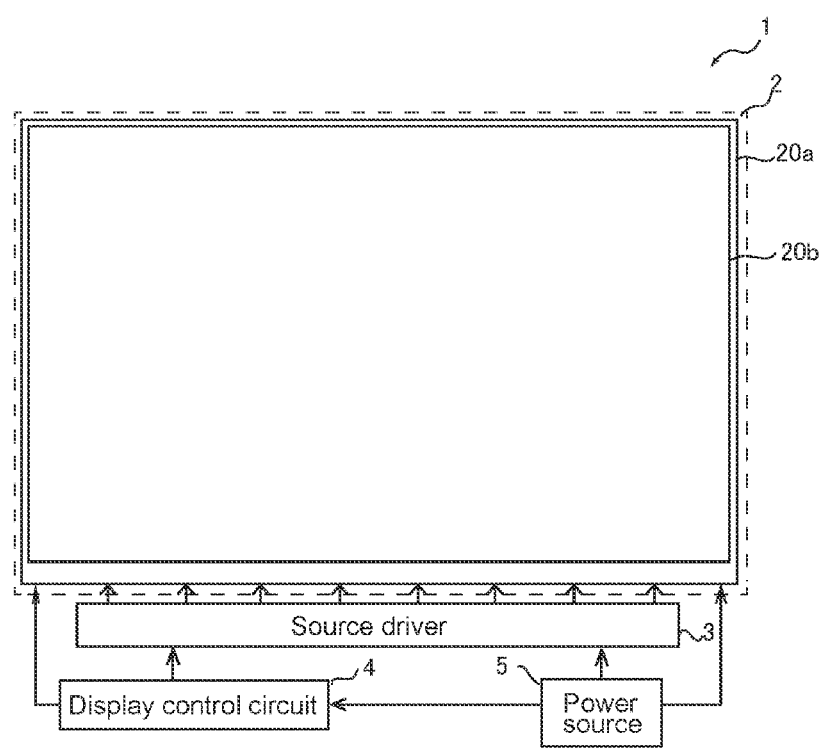
FIG. 16 is a schematic diagram illustrating a schematic configuration of a liquid crystal display device according to Embodiment 2.

The following describes a liquid crystal display device 1 as a display device according to Embodiment 2 of the present invention, while referring to FIG. 16. FIG. 16 illustrates a schematic configuration of the liquid crystal display device 1.

The liquid crystal display device 1 includes a display panel 2, a source driver 3, a display control circuit 4, and a power source 5. The display panel 2 includes an active matrix substrate 20a, a counter substrate 20b, and a liquid crystal layer (not shown) sealed between these substrates.

The active matrix substrate 20a is electrically connected to the source driver 3. The source driver 3 is formed on, for example, a flexible substrate. The display control circuit 4 is electrically connected to the display panel 2, the source driver 3, and the power source 5. The display control circuit 4 outputs control signals to the source driver 3 and the gate driver 11 (see FIG. 18). The gate driver 11 is formed on the active matrix substrate 20a. The control signals include, for example, a reset signal (CLR), clock signals (CKA, CKB), and data signals. The power source 5 is electrically connected to the display panel 2, the source driver 3, and the display control circuit 4. The power source 5 supplies a power source voltage (VSS) to the display panel 2, the source driver 3, and the display control circuit 4.

[Active Matrix Substrate]

Figure 17:
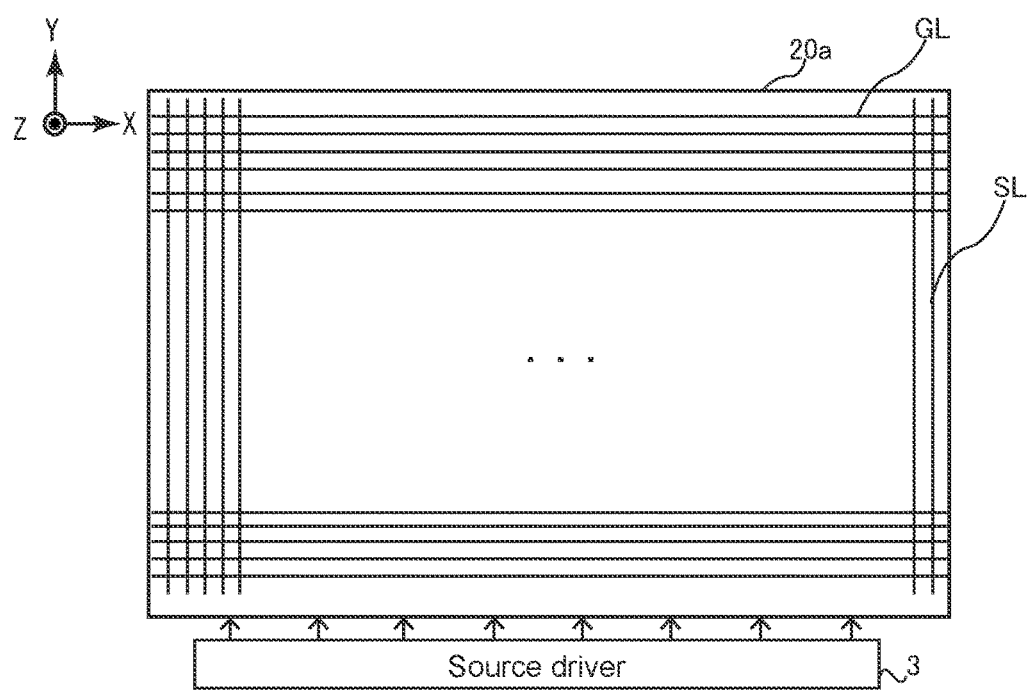
FIG. 17 is a schematic diagram illustrating a schematic configuration of the active matrix substrate illustrated in FIG. 16.
Figure 18:
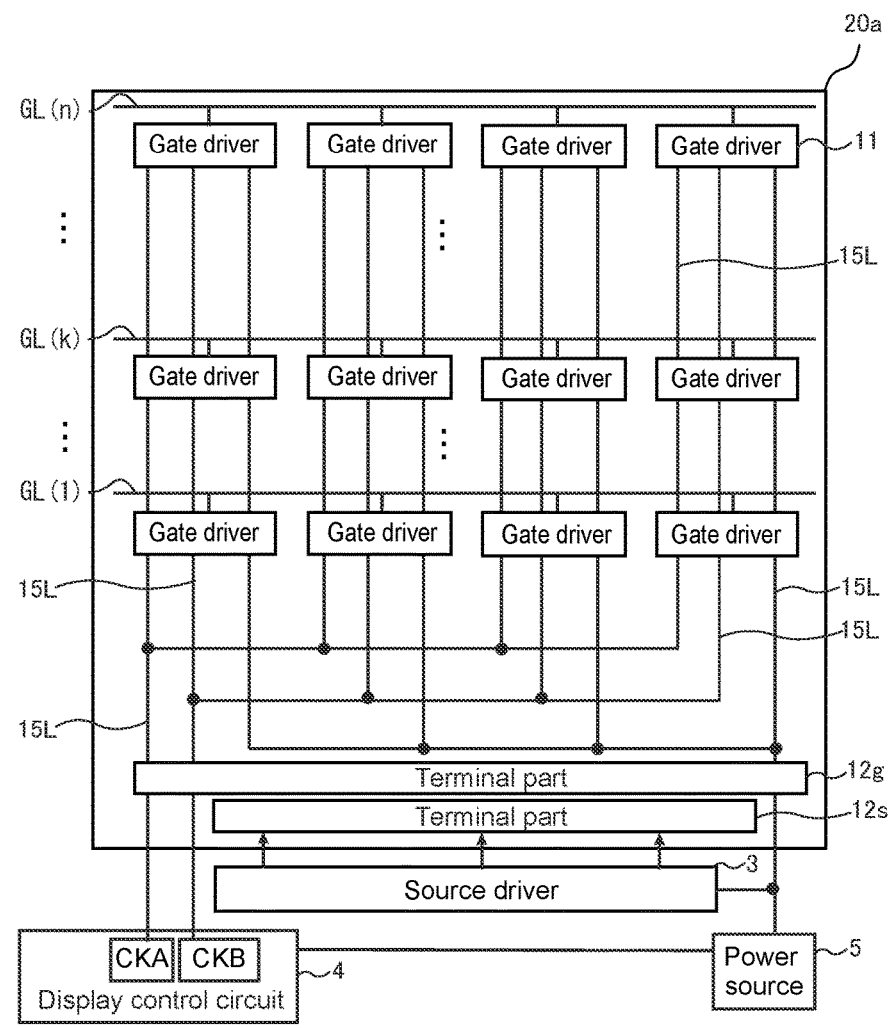
FIG. 18 is a schematic diagram illustrating a schematic configuration of the active matrix substrate illustrated in FIG. 16.

The following describes the active matrix substrate 20a, while referring to FIGS. 17 and 18. FIG. 17 illustrates a schematic configuration of the active matrix substrate 20a. FIG. 18 illustrates a schematic configuration of the active matrix substrate 20a, and parts connected to the active matrix substrate 20a, in which the illustration of the source line SL is omitted.

As illustrated in FIG. 17, in the active matrix substrate 20a, a plurality (n in the present embodiment) of the gate lines GL are formed at approximately uniform intervals in the Y direction. In the active matrix substrate 20a, a plurality of the source lines SL as a plurality of data lines are formed at approximately uniform intervals in the X direction. The source lines SL intersect with the gate lines GL. An area enclosed by two of the gate lines GL that are adjacent to each other in the Y direction, and two of the source lines SL that are adjacent to each other in the X direction, forms one pixel. In a case where the counter substrate 20b includes color filters of, for example, three colors of red (R), green (G), and blue (B), each pixel is arranged so as to correspond to any one of the colors of the color filters. In other words, the display region is defined by a plurality of the gate lines GL and a plurality of the source lines SL.

As illustrated in FIG. 18, the gate driver 11 is formed between two of the gate lines GL that are adjacent in the Y direction. To each gate line GL, four gate drivers 11 are connected. The four gate drivers 11 are arranged at approximately equal intervals.

In a frame region of the active matrix substrate 20a, a terminal part 12g is formed. The terminal part 12g is connected with the control circuit 4 and the power source 5. To the terminal part 12g, control signals output from the control circuit 4, a power source voltage output from the power source 5, and the like are input. The control signals and the power source voltage input to the terminal part 12g are supplied via lines 15L to each gate driver 11.

The gate drivers 11 output state signals to the gate lines GL connected thereto, according to the supplied control signals. The state signals indicate whether the gate lines GL connected to the gate drivers 11 assume a selected state or a non-selected state. Further, the gate drivers 11 output the above-described state signals to the gate lines GL of the next stage. Operations of the four gate drivers 11 connected to one gate line GL are in synchronization with one another.

In a frame region of the active matrix substrate 20a, a terminal part 12s that connects the source driver 3 and the source lines SL. The source driver 3 outputs data signals to each of the source lines SL, according to the control signals input from the display control circuit 4.

[Configuration of Gate Driver]

Figure 19:
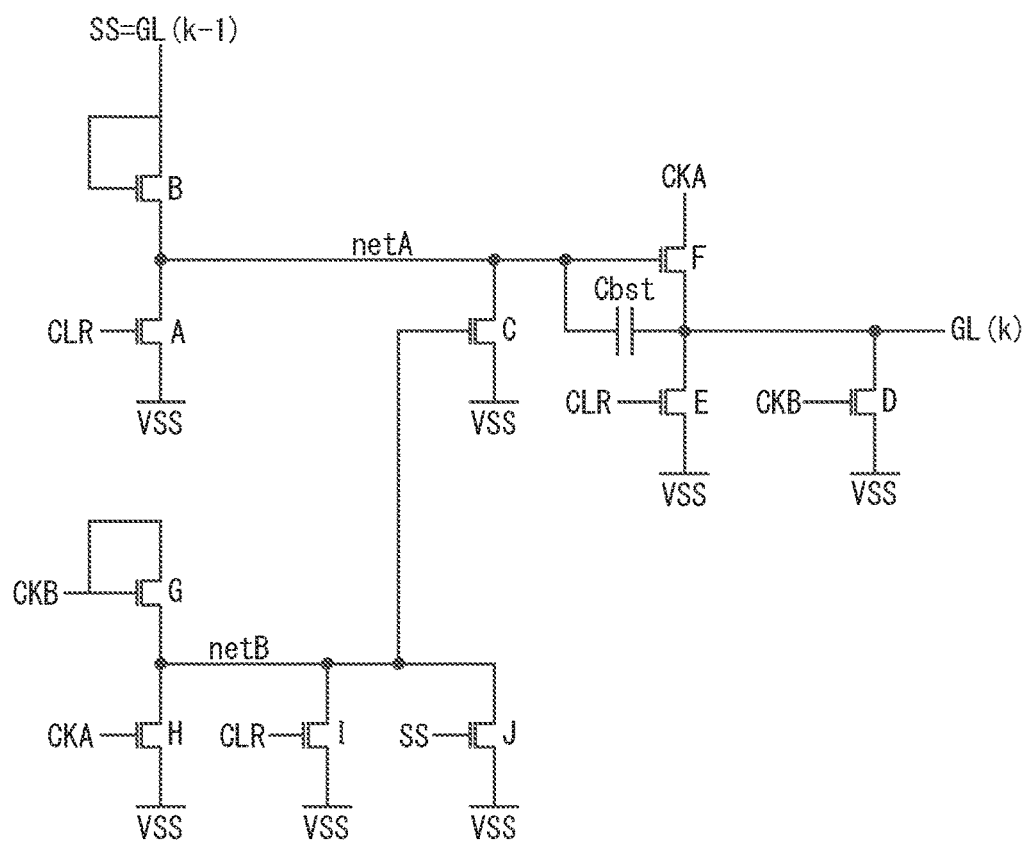
FIG. 19 illustrates an example of an equivalent circuit of a gate driver.

The following describes a configuration of the gate driver 11, while referring to FIG. 19. FIG. 19 illustrates one example of an equivalent circuit of the gate driver 11 (hereinafter referred to as gate driver 11(k)) that is arranged between the gate line GL(k) and the gate line GL(k−1) and is connected to the gate line GL(k). Here, k is an arbitrary integer of 1 to n.

The gate driver 11 includes thin film transistors (hereinafter referred to as TFT-A to TFT-J) as a plurality of switching elements, which are indicated by alphabetic characters A to J. The gate driver 11 further includes a capacitor Cbst, as well as a net A and a net B as internal lines. Here, the net A connects the drain of the TFT-A, the drain of the TFT-B, the drain of the TFT-C, one of the electrodes of the capacitor Cbst, and the gate of the TFT-F. The net B connects the gate of the TFT-C, the drain of the TFT-G, the drain of the TFT-H, the drain of the TFT-I, and the drain of the TFT-J.

In the TFT-A, to the gate thereof, the reset signal CLR is input. To the drain thereof, the net A is connected. To the source thereof, the power source voltage VSS is input.

In the TFT-B, to the gate and source thereof, a gate line GL(k−1) of a preceding stage is connected. In other words, to the gate and source thereof, a set signal SS is input. It should be noted that, in the TFT-B of the gate driver 11 for driving the gate line GL(1), a gate start pulse signal output from the display control circuit 4 is input as the set signal SS. In the TFT-B, to the drain thereof, the net A is connected.

In the TFT-C, to the gate thereof, the net B is connected. To the drain thereof, the net A is connected. To the source thereof, the power source voltage VSS is input.

In the TFT-D, to the gate thereof, the clock signal CKB is input. To the drain thereof, the gate line GL(k) is connected. To the source thereof, the power source voltage VSS is input.

In the TFT-E, to the gate thereof, the reset signal CLR is input. To the drain thereof, the gate line GL(k) is connected. To the source thereof, the power source voltage VSS is input.

In the TFT-F, to the gate thereof, the net A is connected. To the drain thereof, the gate line GL(k) is connected. To the source, a clock signal CKA is input.

In the TFT-G, to the gate and source, the clock signal CKB is input. To the drain thereof, the net B is connected.

In the TFT-H, to the gate, the clock signal CKA is input. To the drain thereof, the net B is connected. To the source thereof, the power source voltage VSS is input.

In the TFT-I, to the gate thereof, the reset signal CLR is input. To the drain thereof, the net B is connected. To the source thereof, the power source voltage VSS is input.

In the TFT-J, to the gate thereof, the gate line GL(k−1) of the preceding stage is connected. In other words, to the gate thereof, the set signal S is input. To the drain thereof, the net B is connected. To the source thereof, the power source voltage VSS is input.

Here, the TFT-J is set to have a larger capability than that of the TFT-G. More specifically, for example, one of the following (1) to (3) is applied.

(1) the channel width of the TFT-J is greater than the channel width of the TFT-G.

(2) the channel length of the TFT-J is smaller than the channel length of the TFT-G.

(3) the channel width of the TFT-J is greater than the channel width of the TFT-G, and the channel length of the TFT-J is smaller than the channel length of the TFT-G.

In the capacitor Cbst, one of the electrodes is connected with the net A. The other electrode is connected with the net B.

Figure 21:
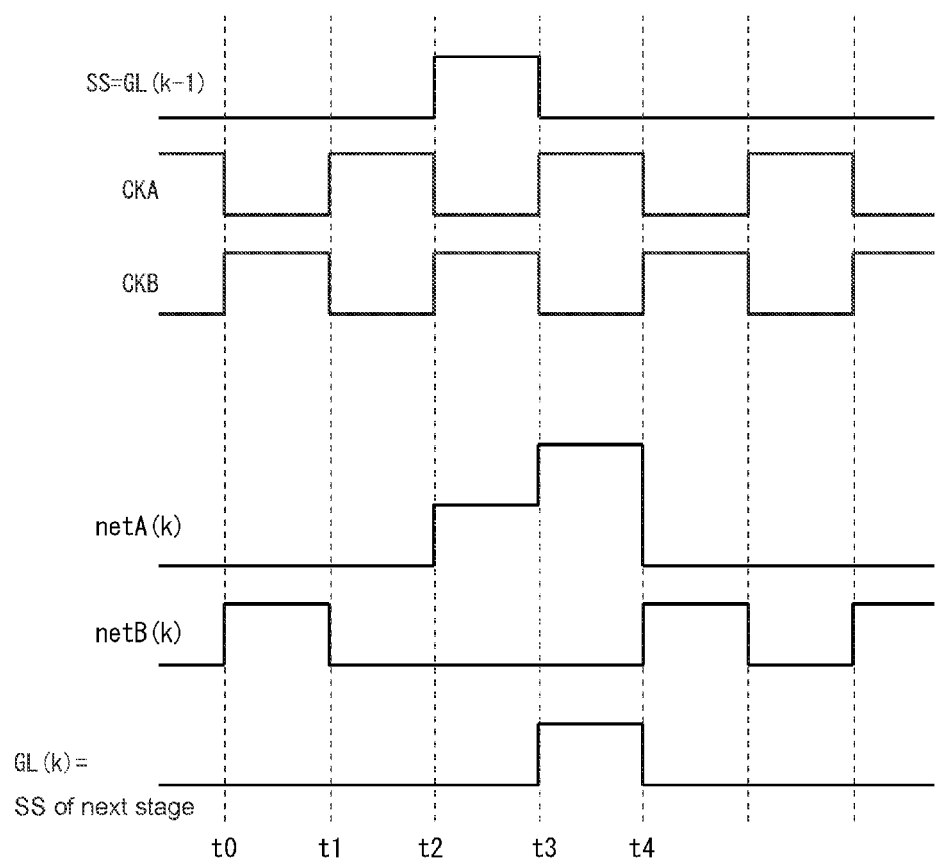
FIG. 21 is a timing chart when the gate drivers illustrated in FIG. 19 control potentials of the gate lines.

The clock signal CKA and the clock signal CKB are two-phase clock signals whose phases are reversed every horizontal scanning period (see FIG. 21). FIG. 19 illustrates the gate driver 11(k), and in the gate driver 11(k+1) of the later stage and the gate driver 11(k−1) of the preceding stage, the clock signal input to the gate of the TFT-D is the clock signal CKA. The clock signal input to the source of the TFT-F is the clock signal CKB. The clock signal input to the gate of the TFT-G is the clock signal CKA. The clock signal input to the gate of the TFT-H is the clock signal CKB.

[Arrangement of Gate Drivers]

Figure 20:
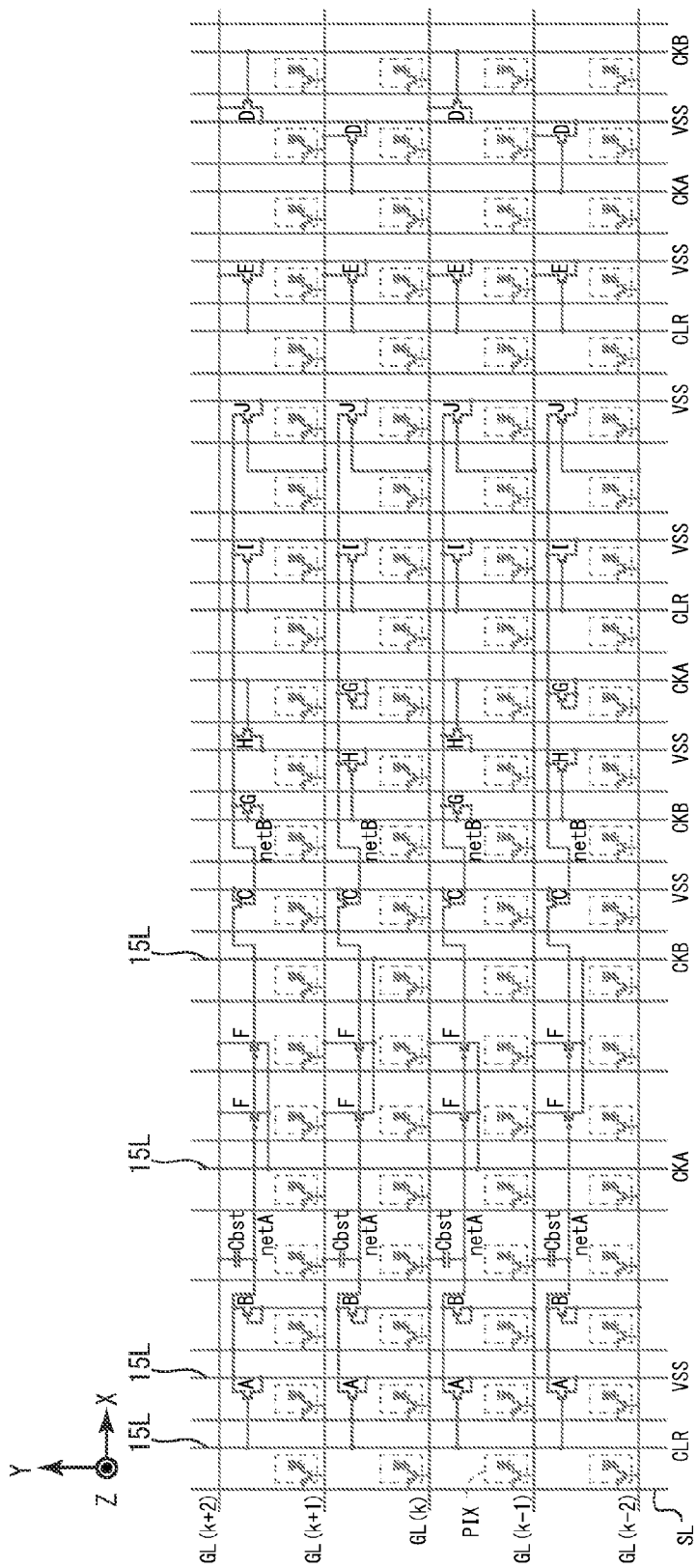
FIG. 20 schematically illustrates an arrangement of the gate drivers illustrated in FIG. 19 in a display region.

The following describes the arrangement of the gate drivers 11 in the display region, while referring to FIG. 20. FIG. 20 schematically illustrates the arrangement of the gate drivers 11 in the display region. It should be noted that the alphabetic characters A to J in FIG. 20 correspond to the TFT-A to TFT-J illustrated in FIG. 4.

Between two of the gate lines GL that are adjacent to each other, elements that compose the gate drivers 11 are arranged dispersedly. In the example illustrated in FIG. 20, the elements composing the gate driver 11(k−1), the elements composing the gate driver 11(k), the elements composing the gate driver 11(k+1), and the elements composing the gate driver 11(k+2) are arranged in pixels PIX in the same column. The TFT-A to TFT-J composing the gate driver 11(k−1) are connected via the line 15L, with the TFT-A to TFT-J composing the gate driver 11(k), the TFT-A to TFT-J composing the gate driver 11(k+1), and the TFT-A to TFT-J composing the gate driver 11(k+2). The line L, the net A, and the net B are formed, for example, in the same layer as the layer in which the source lines SL are formed, and in a layer different from the layer in which the source lines SL are formed, via an interlayer contact. With this, electric short-circuiting of the line L, the net A, and the net B, and the source line SL is avoided.

[Operation of Gate Driver]

The following describes operations of the gate driver 11, while referring to FIGS. 19 and 21. FIG. 21 is a timing chart when the gate driver 11(k) controls the potential of the gate line GL(k).

To the gate driver 11(k), the clock signals CKA, CKB are input, which are supplied from the display control circuit 4, and whose phases are reversed every horizontal scanning period (1H). Though the illustration is omitted in FIG. 21, the reset signal CLR, which is supplied from the display control circuit 4, rises to a H (High) level every perpendicular scanning period and is maintained at the level for a uniform period, is input to the gate driver 11(k). The input of the reset signal CLR causes the potentials of the net A, the net B, and the gate line GL(k) to fall to an L (Low) level.

During a period from time t0 to time t1 in FIG. 21, the clock signal CKA at the L level is input to the source of the TFT-F and the gate of the TFT-H. Further, the clock signal CKB at the H level is input to the gate of the TFT-D and the gate and source of the TFT-G. This causes the TFT-G to be turned ON, and the TFT-H to be turned OFF. Consequently, the potential of the net B increases to the H level. Further, the TFT-C and the TFT-D are turned ON, and the TFT-F is turned OFF. This causes the potential of the net A to fall to the L level. Consequently, the potential of the gate line GL(k) falls to the L level. In other words, the gate line GL(k) assumes a non-selected state.

At time t1 in FIG. 21, the clock signal CKA rises to the H level, and the clock signal CKB falls to the L level. This causes the TFT-G to be turned OFF, and the TFT-H to be turned ON. Consequently, the potential of the net B falls to the L level. Further, the TFT-C and the TFT-D are turned OFF. This causes the potential of the net A to be maintained at the L level. Consequently, the potential of the gate line GL(k) is maintained at the L level.

At time t2 in FIG. 21, the clock signal CKA falls to the L level, and the clock signal CKB rises to the H level. This causes the set signal SS to be input via the gate line GL(k−1) to the gate and source of the TFT-B, and the gate of the TFT-J. With this, the TFT-B is turned ON, and the potential of the net A increases to a level that is lower than the H level by the threshold value voltage Vth of the TFT-B. Further, the TFT-J and the TFT-G are turned ON, and the TFT-H is turned OFF. Here, the TFT-J has a greater capability than the TFT-G. Therefore, the potential of the net B is maintained at the L level. Further, the TFT-C and the TFT-F are turned OFF. This causes the potential of the net A to be maintained. Here, the TFT-D is ON. This causes the potential of the gate line GL(k) to be maintained at the L level.

At time t3 in FIG. 21, the clock signal CKA rises to the H level, and the clock signal CKB falls to the L level. This causes the TFT-F to be turned ON, and the TFT-D to be turned OFF. Between the net A and the gate line GL(k), the capacitor Cbst is provided. Therefore, as the potential of the source of the TFT-F increases, the potential of the net A increases to a level higher than the H level of the clock signal CKA. Here, the TFT-G and the TFT-J are turned OFF, and the TFT-H is turned ON. This causes the potential of the net B to be maintained at the L level. Further, the TFT-C is OFF. This causes the potential of the gate line GL(k) to increase to the H level. In other words, the gate line GL(k) assumes a selected state.

At time t4 in FIG. 21, the clock signal CKA falls to the L level, and the clock signal CKB rises to the H level. This causes the TFT-G to be turned ON, and the TFT-H to be turned OFF. Consequently, the potential of the net B increases to the H level. The increase of the potential of the net B to the H level causes the TFT-C to be turned ON, which causes the potential of the net A to decrease to the L level. Here, the TFT-D is turned ON, and the TFT-F is turned OFF. This causes the potential of the gate line GL(k) to decrease to the L level. In other words, the gate line GL(k) assumes a non-selected state.

In this way, the set signal SS is output from the gate driver 11(k) to the gate line GL(k), thereby causing the gate line GL(k) to assume selected state. The liquid crystal display device 1 sequentially scans the gate lines GL by using the gate drivers 11 connected to the gate lines GL, and supplies data signals to the source lines SL, respectively, by using the source driver 3, thereby causing an image to be displayed on the display panel 2.

[Measures to Static Electricity]

Figure 22:
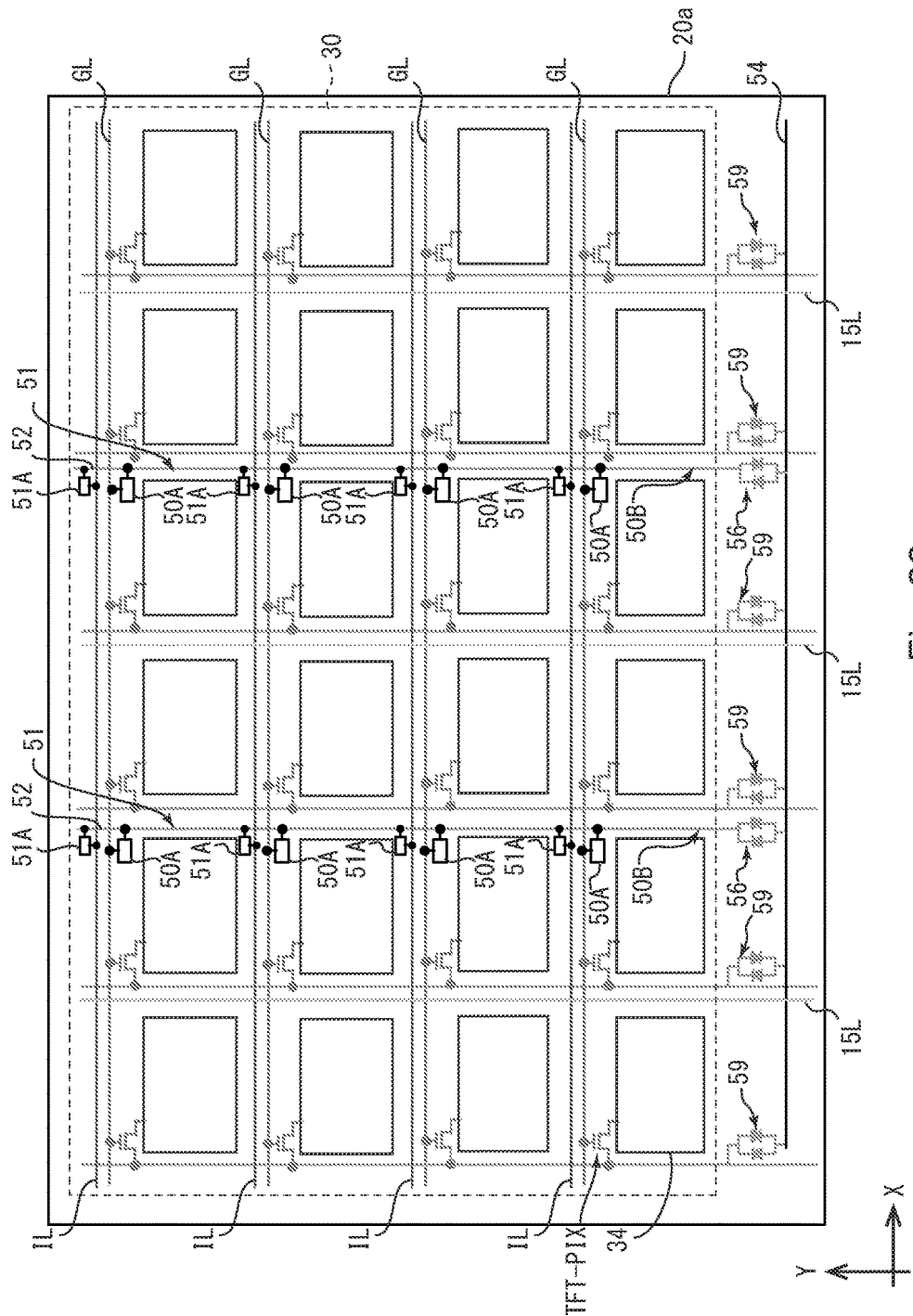
FIG. 22 schematically illustrates a schematic configuration of the active matrix substrate illustrated in FIG. 16.

The following describes a protection part 51 for protecting the active matrix substrate 20a from static electricity, while referring to FIG. 22. In the example illustrated in FIG. 22, a plurality (two in the present embodiment) of the protection parts 51 are arranged, but the number of the protection parts 51 may be one.

The protection part 51, as compared with the protection part 50, further includes a plurality of protection circuits 51A. Each of the protection circuits 51A is arranged in the vicinities of the point of intersection between the internal line IL and the protection line 52. The internal lines IL are, for example, the net A or the net B. The protection circuit 51A has a configuration that is, for example, the same as that of the protection circuit 50A.

In the present embodiment, in a case where a significant change is caused by static electricity in the potential of the internal line IL in the plus direction or in the minus direction, as is the case with a significant change caused by static electricity in the potential of the gate line GL in the plus direction or the minus direction, the potential of the internal line IL can be adjusted to a predetermined potential (for example, the potential before the change) by the protection circuit 51A.

In the present embodiment, the gate drivers 11 are arranged in the display region. Therefore, as compared with a case where the gate drivers 11 are arranged outside the display region, the frame region can be narrowed further.

[Shape of Panel]

In the present embodiment, the gate drivers 11 are arranged in the display region. Therefore, for example, the display panel 2 in the shape illustrated in FIG. 23 or in FIG. 24 can be realized. Areas 92 illustrated in FIG. 23 or FIG. 24 are areas where the gate drivers 11 are arranged.

The protection lines 52 can be appropriately arranged according to the shape of the panel 2.

Figure 23:
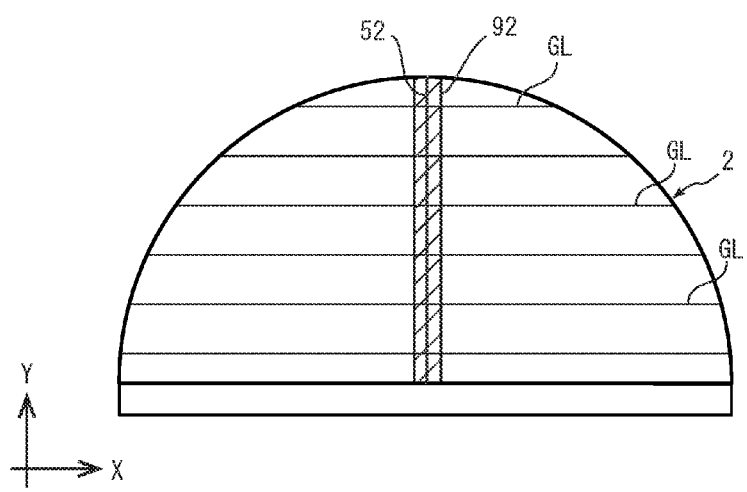
FIG. 23 schematically illustrates an example of a display panel in a shape other than the rectangular shape.

In a case where, for example, the panel 2 is in a semicircular shape as illustrated in FIG. 23, one protection line 52 may be provided at the center in the X direction in the area 92, whereby all the gate lines GL can be protected from static electricity.

Figure 24:
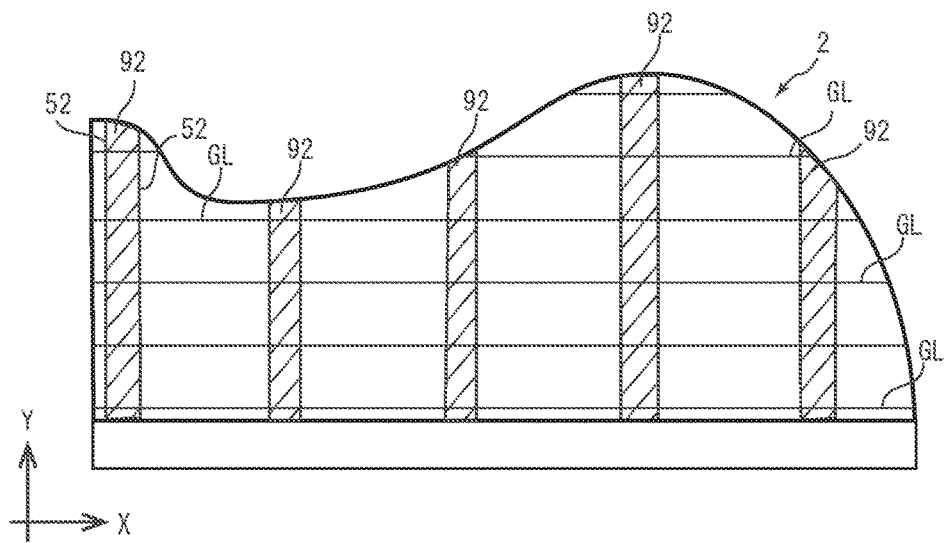
FIG. 24 schematically illustrates an example of a display panel in a shape other than the rectangular shape.
Figure 24A:
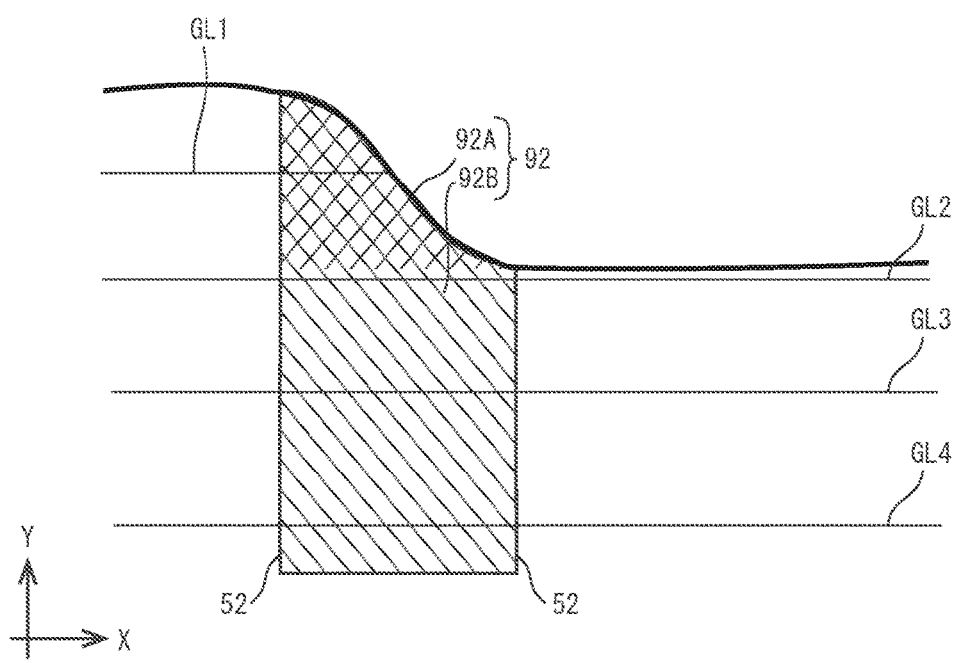
FIG. 24A schematically illustrates a part of the panel in FIG. 24.

In a case where, for example, the edge of the panel 2 is in a wave shape as illustrated in FIG. 24, it is necessary to provide a plurality of areas 92 so as to control all of the potentials of the gate lines GL. For example, in the example illustrated in FIG. 24A, the gate drivers 11 in the area 92A are in a state of not operating normally, or in a state with a high possibility of not operating normally. The gate drivers 11 in the area 92B operate normally. In this case, the potential of the gate line GL1 is controlled by the gate driver 11 in areas 92 other than the area 92 illustrated in FIG. 24A (more specifically, the areas 92 positioned on the left side with respect to the area 92 illustrated in FIG. 24A). The potentials of the gate lines GL2 to GL4 are controlled by the gate drivers 11 in the area 92 illustrated in FIG. 24A.

The protection line 52 is arranged, for example, on both ends in the X direction of the area 92. In the example illustrated in FIG. 24A, all of the gate lines GL in the area 92 can be protected by the protection line 52 positioned on the left end of the area 92, that is, the longer protection line 52 among the protection lines 52 positioned on the left and right ends of the area 92.

The embodiments of the present invention are described above, but the above-described embodiments are merely examples for implementing the present invention. The present invention, therefore, is not limited to the above-described embodiments, and the above-described embodiments can be appropriately varied and implemented without departing from the scope of the invention.

The invention claimed is:

1. An active matrix substrate, comprising:
   a plurality of first lines that are in a display region, the display region being bounded by an area in which a plurality of pixels are located; and
   a plurality of second lines that are in the display region, and intersect with the first lines,
   a plurality of first protection circuits, each of the plurality of first protection circuits being located in the display region and connected to each of the first lines in the display region; and
   a protection line that is connected to each of the first protection circuits in the display region, wherein
   each of the first protection circuits, according to a potential of the first line to which the first protection circuit is connected, allows the first line and the protection line to be conductive with each other,
   the first lines include a plurality of gate lines,
   the active matrix substrate further includes a driving unit that is connected to the gate lines so as to control potentials of the gate lines,
   the driving unit includes a plurality of gate drivers that are arranged in the display region, at least one of the gate drivers being connected to each of the gate lines,
   the first lines further include a plurality of internal lines, at least one of the internal lines being provided in each of the gate drivers,
   the first protection circuits are connected to each of the gate lines, and
   the active matrix substrate further includes a plurality of fourth protection circuits that are connected to each of the internal lines in the display region, are connected to the protection line, and are different from the first protection circuits.

2. The active matrix substrate according to claim 1, further comprising:
   a second protection circuit connected to the protection line around the display region; and
   a common line connected to the second protection circuit.

3. The active matrix substrate according to claim 2, further comprising:
   a plurality of third protection circuits that are connected to each of the second lines around the display region, and are connected to the common line.

4. The active matrix substrate according to claim 3, wherein the common line includes a first common line connected with the second protection circuit and a second common line connected with the third protection circuit.

5. The active matrix substrate according to claim 4, wherein the first common line is connected with a common electrode via a fifth protection circuit; and
   wherein the second common line is connected with the common electrode via a sixth protection circuit.

6. The active matrix substrate according to claim 1, further comprising:
   a plurality of third line portions connected to each of the fourth protection circuits.

7. The active matrix substrate according to claim 1,
wherein the first protection circuit includes:
- a first diode; and
- a second diode that is arranged in parallel to the first diode, and is connected in an orientation opposite to that for the first diode.

8. The active matrix substrate according to claim 7,
wherein the first protection circuit includes:
- a first thin film transistor; and
- a second thin film transistor that is provided in parallel to the first thin film transistor, wherein either one of a source and a drain of the first thin film transistor is connected to a gate, so that the first diode is formed, and either one of the source and the drain of the second thin film transistor is connected to the gate, so that the second diode is formed.

9. The active matrix substrate according to claim 1, further comprising:
- a plurality of pixel electrodes arranged in the display region, wherein each of the pixel electrodes includes a portion that does not contribute to display, and wherein the protection line includes a portion that overlaps the portion that does not contribute to display.

10. A display device comprising the active matrix substrate according to claim 1.

\* \* \* \* \*